United States Patent
Peng et al.

(10) Patent No.: US 11,929,363 B2
(45) Date of Patent: Mar. 12, 2024

(54) SEMICONDUCTOR DEVICE HAVING MULTIPLE ELECTROSTATIC DISCHARGE (ESD) PATHS

(71) Applicant: TAIWAN SEMICONDUCTOR MANUFACTURING CO., LTD., Hsinchu (TW)

(72) Inventors: Po-Lin Peng, Taoyuan (TW); Li-Wei Chu, Hsinchu (TW); Ming-Fu Tsai, Hsinchu (TW); Jam-Wem Lee, Hsinchu (TW); Yu-Ti Su, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/699,493

(22) Filed: Mar. 21, 2022

(65) Prior Publication Data
US 2022/0208753 A1   Jun. 30, 2022

Related U.S. Application Data

(63) Continuation of application No. 16/575,091, filed on Sep. 18, 2019, now Pat. No. 11,282,831.

(51) Int. Cl.
*H01L 27/06* (2006.01)
*H01L 27/02* (2006.01)
(Continued)

(52) U.S. Cl.
CPC ...... *H01L 27/0262* (2013.01); *H01L 27/0207* (2013.01); *H01L 27/0255* (2013.01);
(Continued)

(58) Field of Classification Search
CPC ............ H01L 27/0262; H01L 27/0207; H01L 27/0255; H01L 27/0248; H01L 27/0652;
(Continued)

(56) References Cited

U.S. PATENT DOCUMENTS

| | | |
|---|---|---|
| 5,182,220 A | 1/1993 | Ker et al. |
| 5,576,557 A | 11/1996 | Ker et al. |

(Continued)

FOREIGN PATENT DOCUMENTS

| | | |
|---|---|---|
| CN | 107887375 A | 4/2018 |
| CN | 110021922 A | 7/2019 |

(Continued)

*Primary Examiner* — Ida M Soward
(74) *Attorney, Agent, or Firm* — Maschoff Brennan

(57) ABSTRACT

In some embodiments, a semiconductor device is provided, including a first doped region of a first conductivity type configured as a first terminal of a first diode, a second doped region of a second conductivity type configured as a second terminal of the first diode, wherein the first and second doped regions are coupled to a first voltage terminal; a first well of the first conductivity type surrounding the first and second doped regions in a layout view; a third doped region of the first conductivity type configured as a first terminal, coupled to an input/output pad, of a second diode; and a second well of the second conductivity type surrounding the third doped region in the layout view. The second and third doped regions, the first well, and the second well are configured as a first electrostatic discharge path between the I/O pad and the first voltage terminal.

20 Claims, 33 Drawing Sheets

(51) Int. Cl.
  *H01L 29/08*    (2006.01)
  *H01L 29/10*    (2006.01)
  *H01L 29/74*    (2006.01)
  *H01L 29/86*    (2006.01)
  *H01L 29/87*    (2006.01)
  *H01L 23/60*    (2006.01)
  *H01L 23/62*    (2006.01)
  *H01L 29/747*   (2006.01)
  *H01L 29/861*   (2006.01)

(52) U.S. Cl.
  CPC .............. *H01L 29/87* (2013.01); *H01L 23/60* (2013.01); *H01L 23/62* (2013.01); *H01L 27/0248* (2013.01); *H01L 27/0652* (2013.01); *H01L 27/0658* (2013.01); *H01L 29/0804* (2013.01); *H01L 29/0821* (2013.01); *H01L 29/1004* (2013.01); *H01L 29/747* (2013.01); *H01L 29/8611* (2013.01); *H01L 2924/13034* (2013.01); *H01L 2924/13035* (2013.01)

(58) Field of Classification Search
  CPC . H01L 27/0658; H01L 27/0296; H01L 29/87; H01L 29/0804; H01L 29/0821; H01L 29/1004; H01L 29/747; H01L 29/8611; H01L 23/60; H01L 23/62; H01L 2924/13034; H01L 2924/13035; H02H 9/00; H02H 9/02; H02H 9/04
  See application file for complete search history.

(56) References Cited

U.S. PATENT DOCUMENTS

| | | | |
|---|---|---|---|
| 5,898,193 A | 4/1999 | Ham | |
| 7,067,884 B2* | 6/2006 | Okushima | H01L 27/0255 257/501 |
| 7,187,037 B2 | 3/2007 | Morishita | |
| 7,372,083 B2 | 5/2008 | Lee et al. | |
| 7,494,854 B2* | 2/2009 | Ker | H01L 27/0266 438/149 |
| 7,525,779 B2 | 4/2009 | Chen et al. | |
| 7,542,253 B2 | 6/2009 | Ker et al. | |
| 7,763,941 B2 | 7/2010 | Kim et al. | |
| 7,880,195 B2 | 2/2011 | Ker et al. | |
| 7,985,640 B2 | 7/2011 | Salcedo et al. | |
| 8,049,250 B2 | 11/2011 | Song et al. | |
| 8,110,876 B2 | 2/2012 | Li et al. | |
| 8,350,355 B2 | 1/2013 | Esmark | |
| 8,779,519 B1 | 7/2014 | Lin et al. | |
| 8,803,276 B2 | 8/2014 | Chang et al. | |
| 8,809,961 B2 | 8/2014 | Tsai et al. | |
| 8,941,959 B2 | 1/2015 | Su et al. | |
| 8,994,068 B2 | 3/2015 | Zhan et al. | |
| 9,502,399 B1* | 11/2016 | Smith | H01L 29/732 |
| 9,876,005 B2 | 1/2018 | Su et al. | |
| 10,224,282 B2 | 3/2019 | Huang | |
| 10,439,024 B2 | 10/2019 | Taghizadeh Kaschani et al. | |
| 10,446,537 B2 | 10/2019 | Boselli et al. | |
| 10,643,988 B2 | 5/2020 | Chang et al. | |
| 10,700,056 B2 | 6/2020 | Zhao et al. | |
| 10,944,255 B2 | 3/2021 | Tseng | |
| 2003/0234405 A1* | 12/2003 | Lai | H01L 27/0817 257/107 |
| 2004/0201033 A1* | 10/2004 | Russ | H01L 27/0262 257/107 |
| 2005/0045909 A1* | 3/2005 | Zhang | H01L 29/87 257/173 |
| 2005/0236674 A1 | 10/2005 | Morishita | |
| 2006/0081935 A1 | 4/2006 | Morishita | |
| 2006/0278930 A1* | 12/2006 | Huang | H01L 27/0259 257/361 |
| 2007/0284665 A1 | 12/2007 | Nagai et al. | |
| 2008/0137243 A1 | 6/2008 | Yang | |
| 2008/0217650 A1* | 9/2008 | Morishita | H01L 29/7436 257/E29.225 |
| 2010/0155775 A1* | 6/2010 | Gauthier, Jr. | H01L 29/74 716/136 |
| 2011/0207409 A1 | 8/2011 | Ker et al. | |
| 2011/0286135 A1 | 11/2011 | Campi, Jr. et al. | |
| 2012/0043583 A1 | 2/2012 | Abou-Khalil et al. | |
| 2012/0074539 A1 | 3/2012 | Yu et al. | |
| 2013/0228824 A1 | 9/2013 | Morishita | |
| 2014/0027815 A1 | 1/2014 | Su et al. | |
| 2014/0138735 A1* | 5/2014 | Clarke | H01L 29/7412 257/119 |
| 2014/0167099 A1* | 6/2014 | Mergens | H01L 29/87 257/109 |
| 2014/0217461 A1 | 8/2014 | Song et al. | |
| 2015/0137174 A1 | 5/2015 | Lee et al. | |
| 2015/0187749 A1 | 7/2015 | Dai | |
| 2015/0236011 A1 | 8/2015 | Wang et al. | |
| 2016/0056147 A1* | 2/2016 | Li | H01L 27/0262 257/173 |
| 2016/0079228 A1 | 3/2016 | Edwards et al. | |
| 2017/0012037 A1 | 1/2017 | De Raad et al. | |
| 2017/0287895 A1* | 10/2017 | Wang | H01L 29/7436 |
| 2018/0219006 A1 | 8/2018 | Lee et al. | |
| 2018/0277633 A1 | 9/2018 | Yoshioka | |
| 2018/0301445 A1 | 10/2018 | Yam et al. | |
| 2020/0227914 A1 | 7/2020 | Salcedo et al. | |

FOREIGN PATENT DOCUMENTS

| | | | |
|---|---|---|---|
| KR | 20100073966 A * | 7/2010 | ......... H01L 27/0206 |
| TW | 200826277 A | 6/2008 | |
| TW | 202139413 A | 10/2021 | |
| WO | 95/10855 A1 | 4/1995 | |
| WO | 2017041334 A1 | 3/2017 | |

* cited by examiner

1000

SEMICONDUCTOR DEVICE HAVING MULTIPLE ELECTROSTATIC DISCHARGE (ESD) PATHS

CROSS-REFERENCE

The present application is a continuation application of U.S. application Ser. No. 16/575,091, filed Sep. 18, 2019, now U.S. Pat. No. 11,282,831, issued Mar. 22, 2022, the full disclosures of which are incorporated herein by reference.

BACKGROUND

An ESD event produces extremely high voltages and leads to pulses of high current of a short duration that can damage integrated circuit devices. As such, diode string triggered SCRs (DTSCR) or low voltage triggered SCRs (LVTSCR) are widely used for low capacitance ESD protection. In some situations, DTSCRs suffer from voltage overshoot during ESD events, while LVTSCRs have performance required to improve because of capacitance factor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
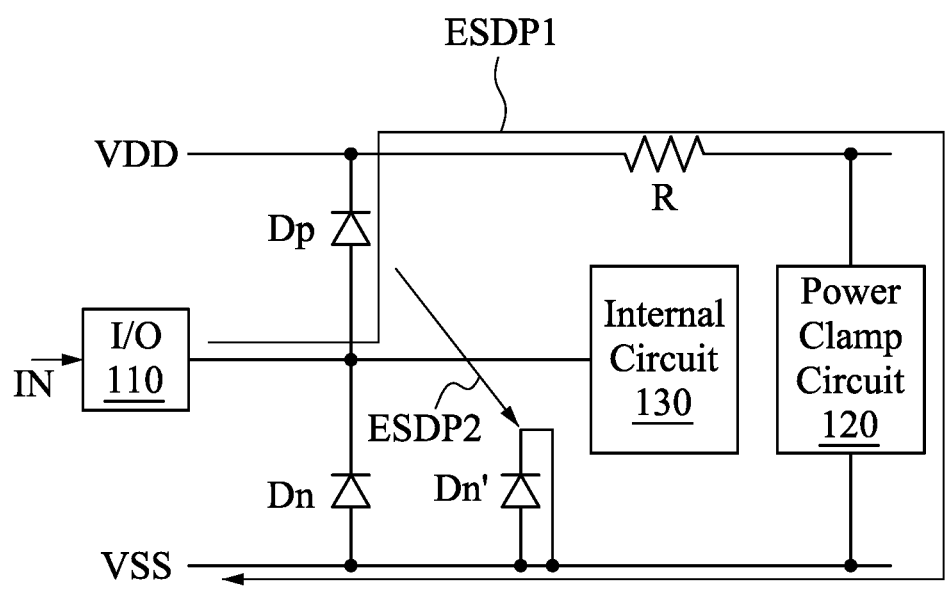
FIG. 1 is an equivalent circuit of part of a semiconductor device, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is now made to FIG. 1. FIG. 1 is an equivalent circuit of part of a semiconductor device 100, in accordance with various embodiments. For illustration, the semiconductor device 100 includes an input/output (I/O) pad 110, diodes Dp, Dn and Dn', a resistance R, a power clamp circuit 120, and an internal circuit 130. As illustrated in FIG. 1, an anode of the diode Dp is coupled to the I/O pad 110 and a cathode of the diode Dp is coupled to a voltage terminal configured to receive a supply voltage SVDD from a voltage terminal VDD. The resistance R is coupled between the diode Dp and the power clamp circuit 120. The power clamp circuit 120 is coupled between the voltage terminal VDD and a voltage terminal configured to receive a supply voltage SVSS from a voltage terminal VSS. The power clamp circuit 120 is configured to clamp a voltage between the voltage terminal VDD and the voltage terminal VSS in some embodiments. An anode and a cathode of the diode Dn' are coupled to the voltage terminal VSS. An anode of the diode Dn is coupled to the voltage terminal VSS. A cathode of the diode Dn, the I/O pad 110, and the anode of the diode Dp are coupled to each other.

As illustrated in FIG. 1, the internal circuit 130 is coupled to the I/O pad 110. In some embodiments, the internal circuit 130 is configured to receive signals inputted through the I/O pad 110, or to transmit signals outputted through the I/O pad 110. In some embodiments, the internal circuit 130 includes logics or circuits that are configured to process, or operate in response to, external signals transmitted through the I/O pad 110.

In some embodiments, the diodes Dp, Dn and Dn' are formed by disposing N-type diffusion regions and P-type diffusion regions in N-type well regions or P-type well regions on a substrate. The details of the configuration of the diodes Dp, Dn and Dn' will be discussed in the following paragraphs. However, the scope of the disclosure is not intended to be limited in the above-mentioned types, and other suitable arrangement of types of the diodes Dp, Dn and Dn' are within the contemplated scope of the present disclosure.

In some embodiments, the resistance R represents the resistance contributed by the metal routing arranged to couple the power clamp circuit 120 with the voltage terminal VDD, the diode Dp, or other corresponding elements. In various embodiments, the resistance R is omitted and thus does not affect operations of circuits in the semiconductor device 100.

For illustration, as shown in FIG. 1, the anode of the diode Dn is configured to receive the supply voltage SVSS. The cathode of the diode Dp is configured to receive the supply voltage SVDD. In some embodiments, the supply voltage SVSS is a ground voltage, and the supply voltage SVDD is a power voltage.

During an electrostatic discharge (ESD) event, there is an instantaneous built-up of a substantial electrical positive potential at the I/O pad 110, which is generally caused by direct or indirect contact with an electrostatic field. As the ESD event occurs, multiple ESD paths, including, for example, ESDP1 and ESDP2 as shown in FIG. 1, are conducted in the semiconductor device 100, for the ESD current IN to be discharged. Specifically, as shown in FIG. 1, one part of the ESD charge current IN flows between the I/O pad 110 and the voltage terminal VSS, and is directed through the ESD path ESDP1 which is formed by the diode Dp, the resistance R and the power clamp circuit 120. Another part of the ESD charge current IN flows between the I/O pad 110 and the voltage terminal VSS, and is directed through the ESD path ESDP2 in which the diode Dp and the diode Dn' include a semiconductor structure configured to discharge part of the ESD current IN. Details of the semiconductor structure included in the diode Dp and the diode Dn' are discussed below.

Figure 2A:
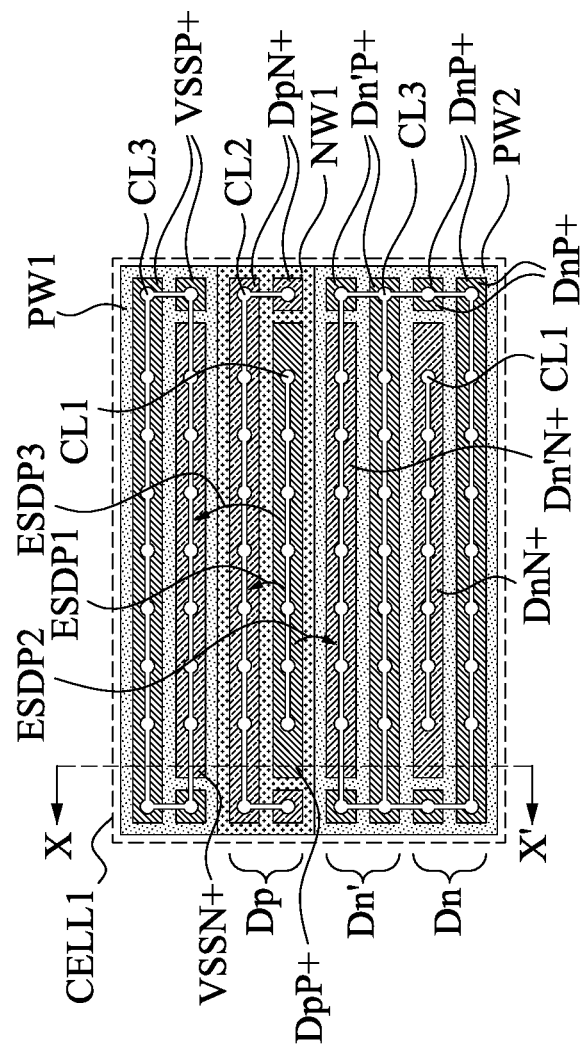
FIG. 2A is a layout diagram in a plan view of a section of the semiconductor device in FIG. 1 in accordance with some embodiments.
Figure 2B:
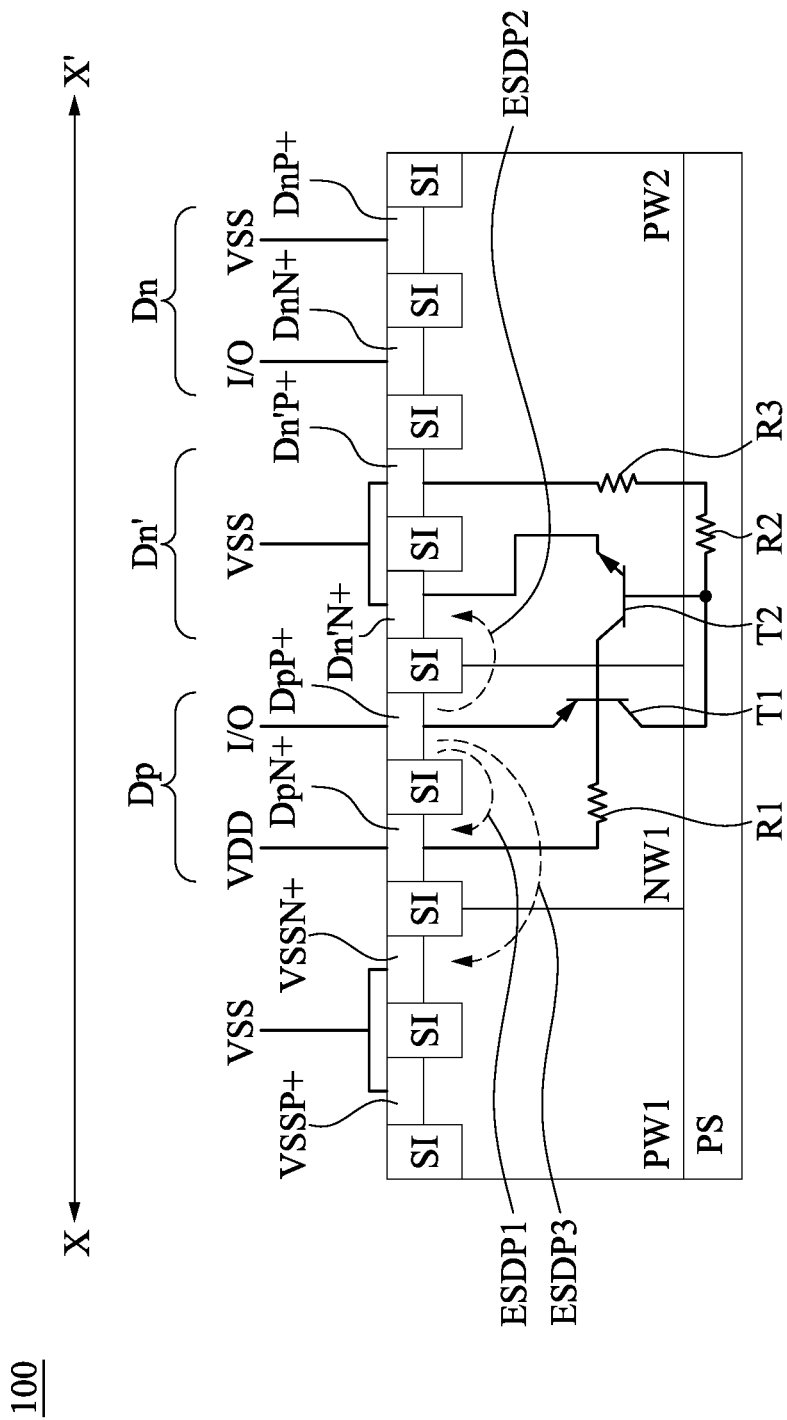
FIG. 2B is a cross-sectional view of the layout diagram of the semiconductor device in FIG. 2A, in accordance with various embodiments.

For further understanding the structure of part of the semiconductor device 100 shown in the embodiments in FIG. 1, reference is now made to FIG. 2A and FIG. 2B. FIG. 2A is a layout diagram in a plan view of a section of the semiconductor device 100 in FIG. 1 in accordance with some embodiments. FIG. 2B is a cross-sectional view of the layout diagram of the semiconductor device 100 in FIG. 2A along line XX', in accordance with various embodiments.

For illustration, as shown in FIG. 2A and FIG. 2B, the semiconductor device 100 includes a P-well PW1, an N-well NW1, a P-well PW2 that are disposed on a P-type substrate PS (as shown in FIG. 2B), the diodes Dp, Dn' and Dn, I/O pad metal connection layers CL1, VDD metal connection layers CL2, and VSS metal connection layers CL3. For simplicity of illustration, the I/O pad metal connection layers CL1, the VDD metal connection layers CL2, and the VSS metal connection layers CL3 are not shown in FIG. 2B.

For illustration, as shown in FIG. 2A, the I/O pad metal connection layers CL1 are disposed on a P+ doped region DpP+ and an N+ doped region DnN+ for the connection of the regions DpP+, DnN+ and the I/O pad 110. The VDD metal connection layers CL2 are disposed on N+ type doped regions DpN+ for the connection of the N+ type doped regions DpN+ and the voltage terminal VDD. The VSS metal connection layers CL3 are disposed on an N+ doped region Dn'N+, a P+ doped region Dn'P+, P+ doped regions DnP+, an N+ doped region DnN+, an N+ doped region VSSN+ and a P+ doped region VSSP+ for the connection of the regions Dn'N+, Dn'P+, DnP+, DnN+, VSSN+, VSSP+, and the voltage terminal VSS.

In some embodiments, the diodes Dp, Dn' and Dn and at least part of the semiconductor structure as discussed above are configured to be formed as an ESD cell CELL1, as shown in FIG. 2A. However, the scope of the disclosure is not intended to be limited in this kind of the ESD cell, and other suitable kinds of the ESD cell are within the contemplated scope of the present disclosure. For example, the width, the length of the doped regions, the spaces between the doped regions and the arrangement of the connection layers can be modified as needed depending on the current capabilities desired for the semiconductor device 100.

In addition to the regions as discussed above with respect to FIG. 2A, the semiconductor device 100 further includes shallow trench isolations (STI) SI. The configurations of the shallow trench isolations SI and the regions as discussed above with respect to FIG. 2A are as shown in FIG. 2B. Moreover, as shown in FIG. 2B, the diode Dp includes the region DpP+ and the region DpN+ formed in the N-well NW1. The region DpP+ is configured as the anode of the diode Dp and configured to be coupled to the I/O pad 110. The region DpN+ is configured as the cathode of the diode Dp and configured to be coupled to the voltage terminal VDD to receive the supply voltage SVDD. The diode Dn' includes a P+ doped region Dn'P+ and an N+ doped region Dn'N+ formed in the P-well PW2 adjacent to the N-well NW1. The region Dn'P+ is configured as the anode of the diode Dn'. The region Dn'N+ is configured as the cathode of the diode Dn'. The regions Dn'P+ and Dn'N+ are configured to be coupled to the voltage terminal VSS to receive the supply voltage SVSS. The diode Dn includes the region DnP+ and the region DnN+ formed in the P-well PW2. The region DnP+ is configured as the anode of the diode Dn and the voltage terminal VSS to receive the supply voltage SVSS. The region DnN+ is configured as the cathode of the diode Dn and configured to be coupled to the I/O pad 110.

With the semiconductor structure as discussed above with respect to FIG. 2B, a parasitic PNP transistor T1, a parasitic NPN transistor T2, and parasitic resistances R1, R2 and R3 are formed and coupled as shown in FIG. 2B. In some embodiments, the parasitic PNP transistor T1, the parasitic NPN transistor T2, and the parasitic resistances R1, R2 and R3 operate together as an equivalent silicon controlled rectifier (SCR) circuit. The equivalent SCR circuit shown in FIG. 2B is given for illustrative purposes. Various equivalent SCR circuits are within the contemplated scope of the present disclosure. For example, in various embodiments, at least one of the parasitic resistance R1, R2, or R3 is omitted.

The parasitic PNP transistor T1 includes the region DpP+ as an emitter, the N-well NW1 as a base, and the P-type substrate PS as a collector. The base of the PNP transistor T1 is coupled to the region DpN+ through a parasitic resistance R1, which represents the intrinsic resistance of N-well NW1. The collector of the parasitic PNP transistor T1 is coupled to the region Dn'P+ through parasitic resistances R2 and R3, in which the parasitic resistance R2 represents the intrinsic resistance of the P-type substrate PS, and the parasitic resistance R3 represents the intrinsic resistance of the P-well PW2. The parasitic NPN transistor T2 includes the N-well NW1 as a collector, the P-well PW2 as a base, and the region Dn'N+ as an emitter. The collector of the parasitic NPN transistor T2 is coupled to the base of the parasitic PNP transistor T1. The base of the parasitic NPN transistor T2 is coupled to the region Dn'P+ through the parasitic resistances R2 and R3. The emitter of the parasitic NPN transistor T2 is coupled to the region Dn'N+.

In some embodiments, the regions VSSN+, DpN+, Dn'N+, DnN+ are doped with n-type dopants, including, such as phosphorus, arsenic, or a combination thereof. The P+ doped regions VSSP+, DpP+, Dn' P+, DnP+ are doped with p-type dopants including, such as boron, indium, aluminum, gallium, or a combination thereof. In some embodiments, the P-wells disclosed herein are formed by doping a substrate with p-type dopants, unless mentioned otherwise. Similarly, the N-wells disclosed herein are formed by doping a substrate with n-type dopants, unless mentioned otherwise. In some embodiments, the P-type substrate PS includes a semiconductor material such as, but not limited to, silicon, germanium, a compound semiconductor including silicon carbide, and gallium arsenide, doped with p-type dopants. In some embodiments, the shallow trench isolations SI are formed by forming trenches in the N-well NW1 and the P-wells PW1, PW2 and filling the trenches with a dielectric material, including, for example, silicon dioxide, a high-density plasma (HDP) oxide, or the like.

With continued reference to FIG. 2B, for illustration, the semiconductor structure included in the diode Dp and diode Dn' is configured as the ESD path ESDP2 (also as shown in FIG. 1), and is configured to operate as the equivalent silicon controlled rectifier (SCR) circuit as discussed above. Alternatively stated, the region DpP+ of the diode Dp, the N-well NW1, the P-type substrate PS, the P-well PW2 and the regions Dn'N+ and Dn'P+ of the diode Dn' are configured to operate as the SCR circuit. For example, in some embodiments, a part of the ESD current IN injected from the I/O pad 110 flows through, the region DpP+, the N-well NW1, the P-type substrate PS, the P-well PW2 and the regions Dn'N+ and Dn'P+ of the diode Dn' to the voltage terminal VSS.

In operation, during the ESD Positive-to-VSS (hereinafter referred to as "PS mode") or positive electrostatic discharged event, the diode Dp and the power clamp circuit 120 of FIG. 1 are turned on to further trigger the SCR circuit of FIG. 2B. At least part of the ESD current IN flows from the I/O pad 110, through the ESD path ESDP1 of FIG. 1 including the region DpP+ of the diode Dp, the N-well NW1, and the region DpN+ of the diode Dp, to the voltage terminal VDD. Moreover, the parasitic transistor T1 and the parasitic transistor T2 are turned on during the PS mode. Thus, another part of the ESD current IN flows from the I/O pad 110, through the ESD path ESDP2 including the parasitic transistor T1 (corresponding to the region DpP+ of the diode Dp, the N-well NW1, the P-type substrate PS), the parasitic resistance R2 (corresponding to the P-type substrate PS), the parasitic transistor T2 (corresponding to the N-well NW1, the P-well PW2, and the region Dn'N+) and the parasitic resistance R3, to the voltage terminal VSS. With the configuration illustrated in FIG. 1, FIG. 2A and FIG. 2B, in addition to the ESD path ESDP1 (in which the ESD current IN flows through the diode Dp, the resistance R in FIG. 1 and the power clamp circuit 120), a part of the ESD current IN is further shunted to ground through the ESD path ESDP2.

In some embodiments, the semiconductor device 100 further includes regions VSSP+ and VSSN+ formed in the P-well PW1, as shown in FIG. 2B. For illustration, the region VSSN+ is doped with n-type dopants as discussed above. With the semiconductor structure including the region VSSN+ in the P-well PW1, an ESD path ESDP3 is also conducted in some embodiments. In various embodiments, the ESD path ESDP3 is also implemented with another equivalent SCR circuit which, for simplicity of illustration, is not shown in FIG. 2B. The other part of the ESD current IN flows from the I/O pad 110 through the ESD path ESDP3 including the region DpP+ of the diode Dp, and the region VSSN+ to the voltage terminal VSS.

The configurations of FIG. 2A and FIG. 2B are given for illustrative purposes. Various configurations of the elements mentioned above in FIG. 2A and FIG. 2B are within the contemplated scope of the present disclosure. For example, in various embodiments, the semiconductor structure including the P-well PW1 and the regions VSSP+ and VSSN+ is omitted.

Figure 3A:
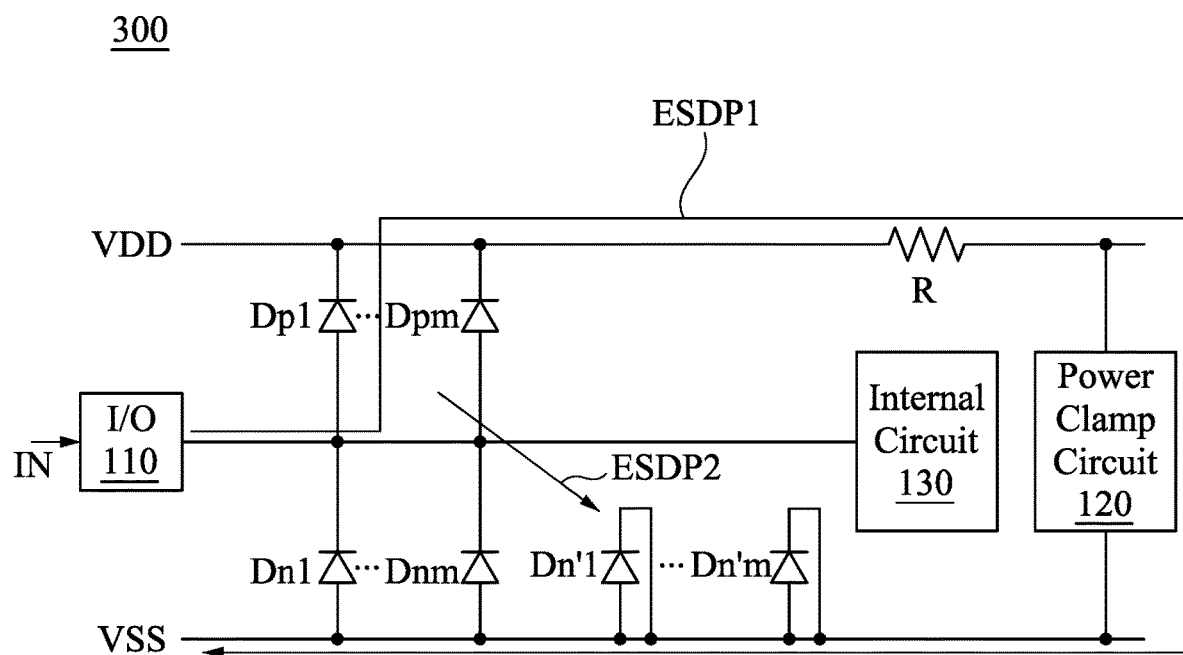
FIG. 3A is an equivalent circuit of part of a semiconductor device.

Reference is now made to FIG. 3A. FIG. 3A is an equivalent circuit of part of a semiconductor device 300 in accordance with various embodiments. With respect to the embodiments of FIG. 3A, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3A.

Compared to the embodiment shown in FIG. 1, the semiconductor device 300 in the embodiment shown FIG. 3A includes a plurality of diodes Dp1-Dpm coupled in parallel between the I/O pad 110 and the voltage terminal VDD, a plurality of diode Dn1-Dnm coupled in parallel between the I/O pad 110 and the voltage terminal VSS, and a plurality of diode Dn' 1-Dn'm coupled in parallel to the voltage terminal VSS. Each of the diodes Dp1-Dpm is identical with the diode Dp as discussed with respect to FIGS. 1-2B, in some embodiments. Each of the diodes Dn1-Dnm is identical with the diode Dn as discussed with respect to FIGS. 1-2B, in some embodiments. Each of the diodes Dn'l-Dn'm is identical with the diode Dn' as discussed with respect to FIGS. 1-2B, in some embodiments. Moreover, in some embodiments, the numbers of the diodes Dp1-Dpm, the diodes Dn1-Dnm and the diodes Dn' 1-Dn'm are different from each other. Alternatively stated, in some embodiments, the semiconductor device 300 includes at least one diode of the diodes Dp2-Dpm coupled to the diode Dp1, at least one diode of the diodes Dn2-Dnm coupled to the diode Dn1, and at least one diode of the diodes Dn'2-Dn'm coupled to the diode Dn'1.

Figure 3B:
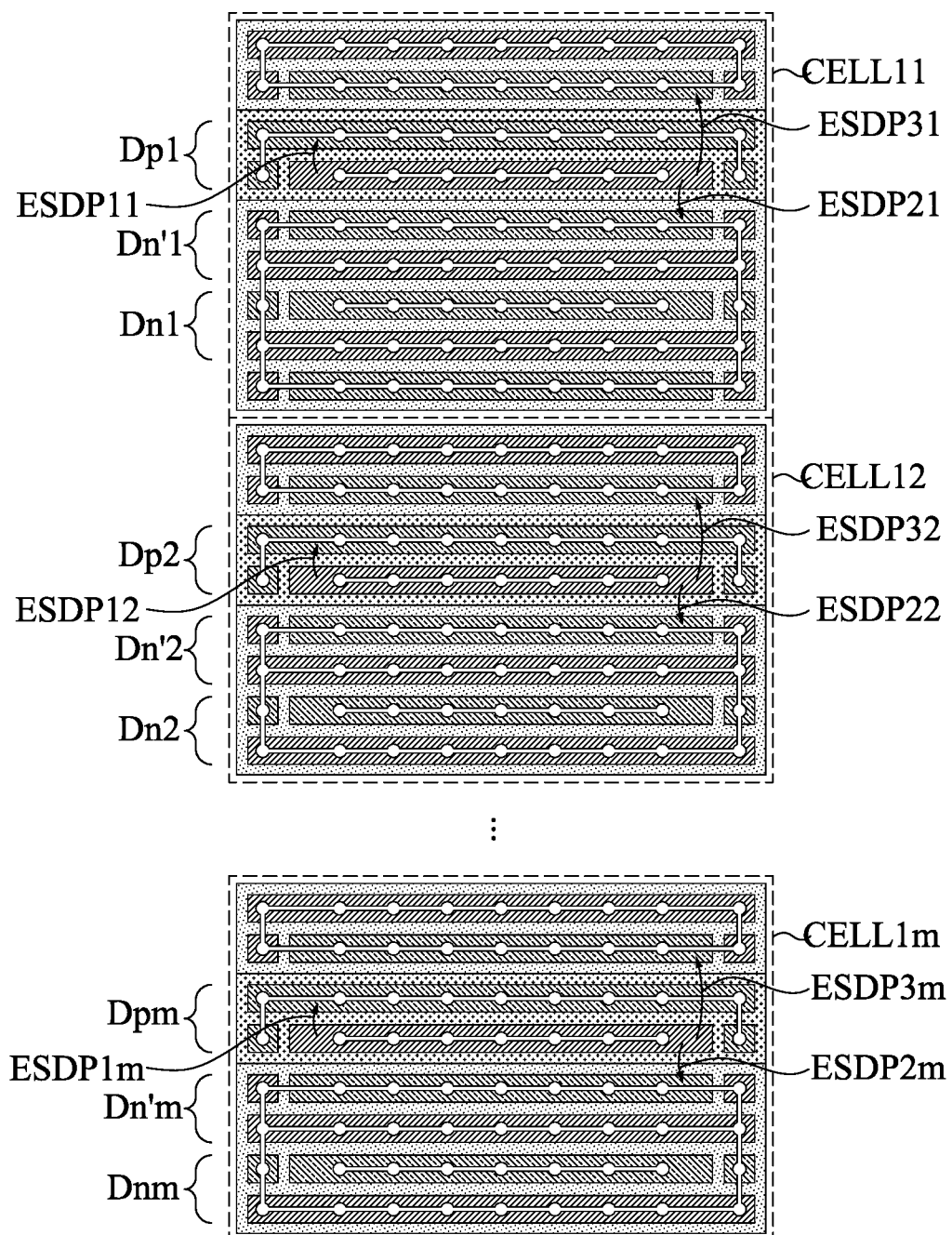
FIG. 3B is a layout diagram in a plan view of a section of the semiconductor device in FIG. 3A in accordance with some embodiments, in accordance with various embodiments.

Reference is now made to FIG. 3B. FIG. 3B is a layout diagram in a plan view of a section of the semiconductor device 300 in FIG. 3A in accordance with some embodiments. For illustration, the semiconductor device 300 includes a plurality of ESD cells CELL11-CELL1m arranged in an array. Each one cell of the ESD cells CELL11-CELL1m has the same configuration with the ESD cell CELL1 in the embodiment shown in FIG. 2A. As shown in FIG. 3B, the ESD cell CELL12 is adjacent to the ESD cell CELL11, the ESD cell CELL13 is adjacent to the ESD cell CELL12, and so on. However, the scope of the disclosure is not intended to be limited in the aforementioned arrangement of the plurality of the ESD cells in the array, and other suitable kinds of the arrangement of the plurality of the ESD cells are within the contemplated scope of the present disclosure. For example, the number of the ESD cells included in the array can be modified as needed depending on the current capabilities desired for the semiconductor device 300.

Specifically illustrated in FIG. 3B, the semiconductor device 300 provides a plurality of ESD path ESDP11-ESDP1m, a plurality of ESD paths ESDP21-ESDP2m, and a plurality of ESD paths ESDP31-ESDP3m offered by the ESD cells CELL11-CELL1m. In some embodiments, each one of the ESD paths ESDP11-ESDP1m has the same configuration with the ESD path ESDP1 in the embodiment shown in FIG. 2A and FIG. 2B. In like manner, each one of the ESD paths ESDP21-ESDP2m has the same configuration with the ESD path ESDP2, and each one of the ESD paths ESDP31-ESDP3m has the same configuration with the ESD path ESDP3. Alternatively stated, the ESD paths ESDP11-ESDP1m are configured to cooperate to discharge a part of the ESD current IN between the I/O pad 110 and the voltage terminal VSS. The ESD paths ESDP21-ESDP2m are configured to cooperate to discharge another part of the ESD current IN through the semiconductor structures included in the diodes Dp1-Dpm and the diodes Dn'1-Dn'm. The ESD paths ESDP31-ESDP3m are configured to cooperate to discharge the other part of the ESD current IN from the anodes of the diodes Dp1-Dpm to the voltage terminal VSS.

The configurations of the diodes Dp1-Dpm, Dn1-Dnm, Dn'l-Dn'm, and the ESD cells CELL11-CELL1m are given for illustrative purposes. Various configurations of the elements mentioned above are within the contemplated scope of the present disclosure. For example, in various embodiments, instead of being arranged in a column as shown in FIG. 3B, the ESD cells CELL11-CELL1m are arranged in a row or a matrix.

Figure 4A:
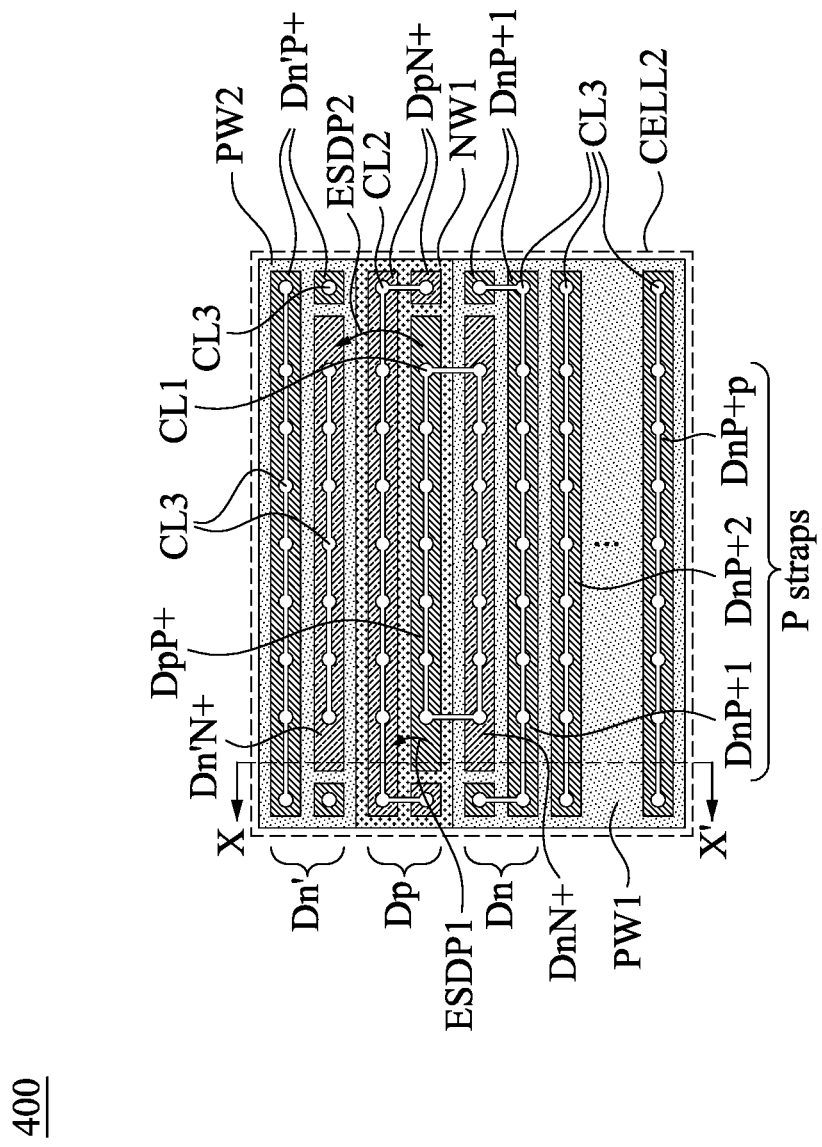
FIG. 4A is a layout diagram in a plan view of a section of a semiconductor device.
Figure 4B:
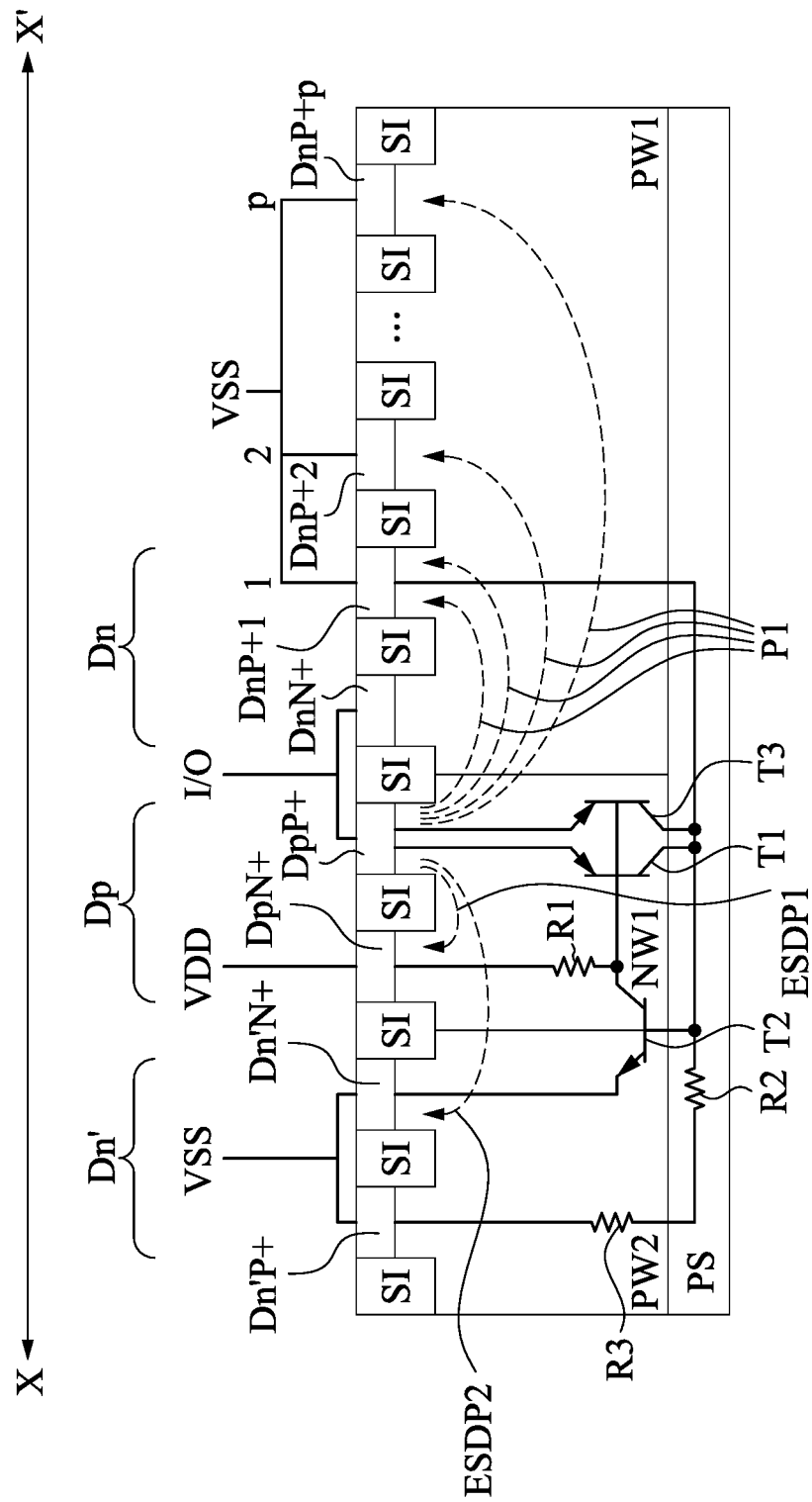
FIG. 4B is a cross-sectional view of the layout diagram of the semiconductor device in FIG. 4A, in accordance with various embodiments.

Reference is now made to FIG. 4A and FIG. 4B. FIG. 4A is a layout diagram in a plan view of a section of a semiconductor device 400 in accordance with various embodiments. FIG. 4B is a cross-sectional view of the layout diagram of the semiconductor device 400 in FIG. 4A along line XX', in accordance with various embodiments. With respect to the embodiments of FIG. 4A and FIG. 4B, like elements in FIG. 2A and FIG. 2B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4A and FIG. 4B.

Compared to the embodiment shown in FIG. 2A and FIG. 2B, for illustration, in the embodiments shown in FIG. 4A and FIG. 4B, the regions Dn'P+ and Dn'N+ of the diode Dn' are disposed in the P-well PW2 at one side of the N-well NW1 while the doped regions of the diode Dn are disposed in the P-well PW1 at the other side of the N-well NW1. Both of the P-wells PW1 and PW2 are adjacent to the N-well NW1. Moreover, a plurality of P+ doped regions DnP+1-DnP+p (each having a strap configuration as shown in FIG. 4A) arranged along the direction of line XX' in the P-well PW1. The region DnP+1 is configured as the anode of the diode Dn. Each region of the P+ doped regions DnP+1-DnP+p is coupled to the voltage terminal VSS via the VSS metal connection layers CL3 disposed thereon. In some embodiments, the aforementioned diodes Dn', Dp and Dn and at least part of the semiconductor structure as discussed above are configured to be formed as a ESD cell CELL-CELL2 as shown in FIG. 4A. It should be noted that, in some other embodiments, the P+ doped regions (not shown in FIG. 4B) are disposed next to the region Dn'N+ in the P-well PW2. Each region of the P+ doped regions is coupled to the voltage terminal VSS via the VSS metal connection layers CL3 disposed thereon.

With the semiconductor structure as discussed above with respect to FIG. 4B, a parasitic PNP transistor T3 is formed and coupled as shown in FIG. 4B. For illustration, the region DpP+ is configured as an emitter of the parasitic PNP transistor T3 to be coupled to the I/O pad 110, the N-well NW1 is configured as a base of the transistor T3, and the P-type substrate PS is configured as a collector of the parasitic PNP transistor T3. The parasitic PNP transistor T3, the P-type substrate PS, the P-well PS, and the regions DnP+1-DnP+p are configured to form as a PNP path P1 for shunting a positive latchup current to the voltage terminal VSS. For example, in some embodiments, during the ESD PS mode event, the diode Dp and the power clamp circuit 120 being turned on, the extra latchup holes caused by positive noises are injected into the diode Dp at the region DpP+. Subsequently, the latchup holes flows through the parasitic PNP transistor T3, the P-type substrate PS, the P-well PW1, the regions VSSP+1-VSSP+p to the voltage terminal VSS which, in some embodiments, is coupled to a ground voltage.

Figure 4C:
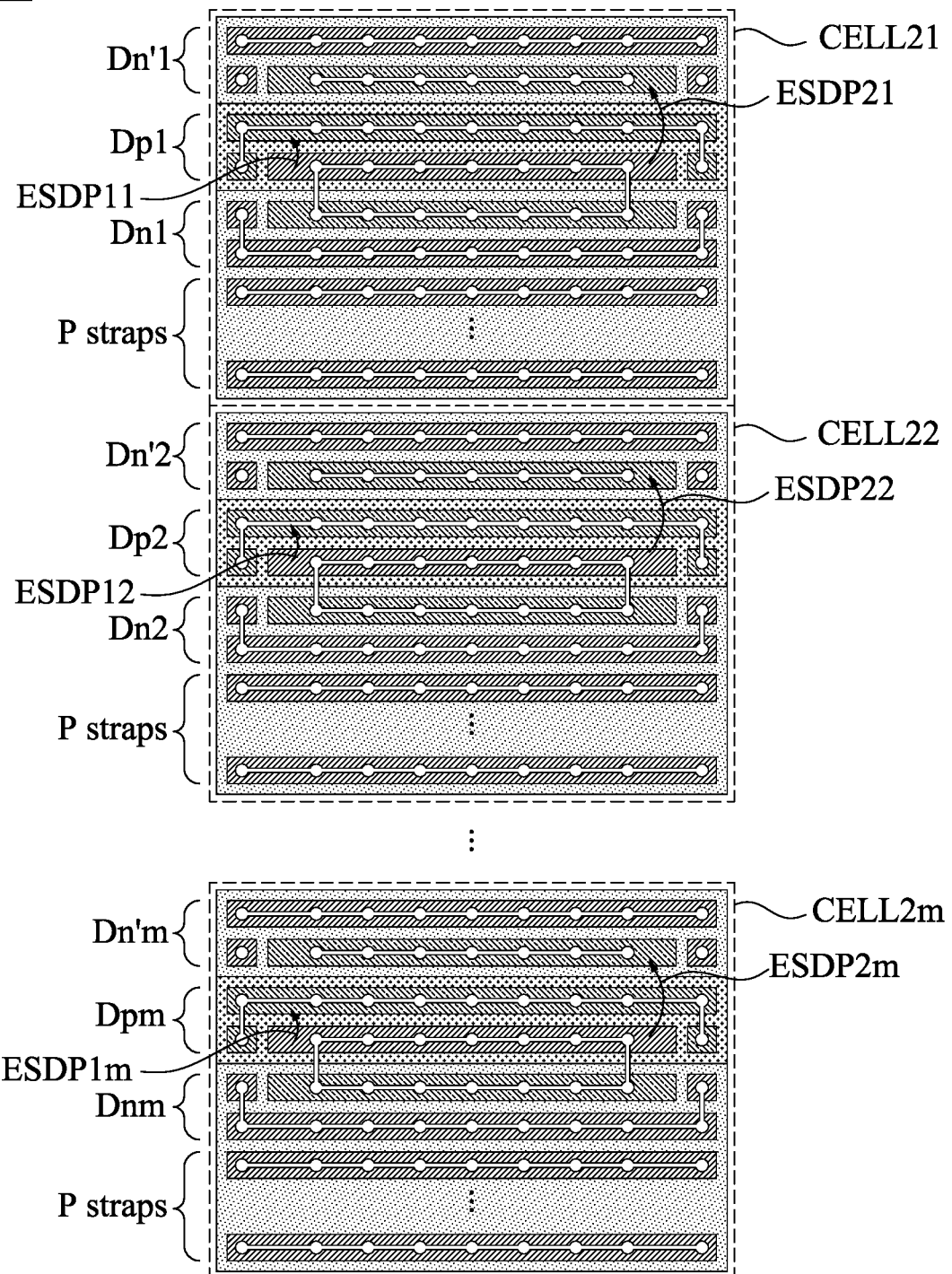
FIG. 4C and FIG. 4D are layout diagrams in a plan view of the semiconductor device in accordance with various embodiments.

Reference is now made to FIG. 4C. FIG. 4C is a layout diagram in a plan view of the semiconductor device 400 in accordance with various embodiments. For illustration, the semiconductor device 400 includes a plurality of ESD cells CELL21-CELL2m in an array. Each one cell of the ESD cells CELL21-CELL2m has the same configuration with the ESD cell CELL2 in the embodiment shown in FIG. 4A. As shown in FIG. 4C, the ESD cell CELL22 is adjacent to the ESD cell CELL21, the ESD cell CELL23 is adjacent to the ESD cell CELL22, and so on. However, the scope of the disclosure is not intended to be limited in the aforementioned arrangement of the plurality of the ESD cells, and other suitable kinds of the arrangement of the array are within the contemplated scope of the present disclosure. For example, the number of the ESD cells included in the array can be modified as needed depending on the current capabilities desired for the semiconductor device 400.

Specifically illustrated in FIG. 4C, the semiconductor device 400 shown provides a plurality of ESD paths ESDP11-ESDP1m, and a plurality of ESD paths ESDP21-ESDP2m offered by the ESD cells CELL21-CELL2m. In some embodiments, each one of the ESD paths ESDP11-ESDP1*m* has the same configuration with the ESD path ESDP1 in the embodiment shown in FIG. 2A and FIG. 2B. In like manner, each one of the ESD paths ESDP21-ESDP2*m* has the same configuration with the ESD path ESDP2. Alternatively stated, the ESD paths ESDP11-ESDP1*m* are configured to cooperate to discharge a part of the ESD current IN between the I/O pad 110 and the voltage terminal VSS. The ESD paths ESDP21-ESDP2*m* are configured to cooperate to discharge the other part of the ESD current IN through the semiconductor structures included in the diodes Dp1-Dp*m* and the diodes Dn'1-Dn'*m*. The semiconductor device 400 also provides a plurality of PNP paths P11-P1*m* (which are not shown in FIG. 4C for the sake of brevity) cooperating to shunting a positive latchup current to the voltage terminal VSS.

Figure 4D:
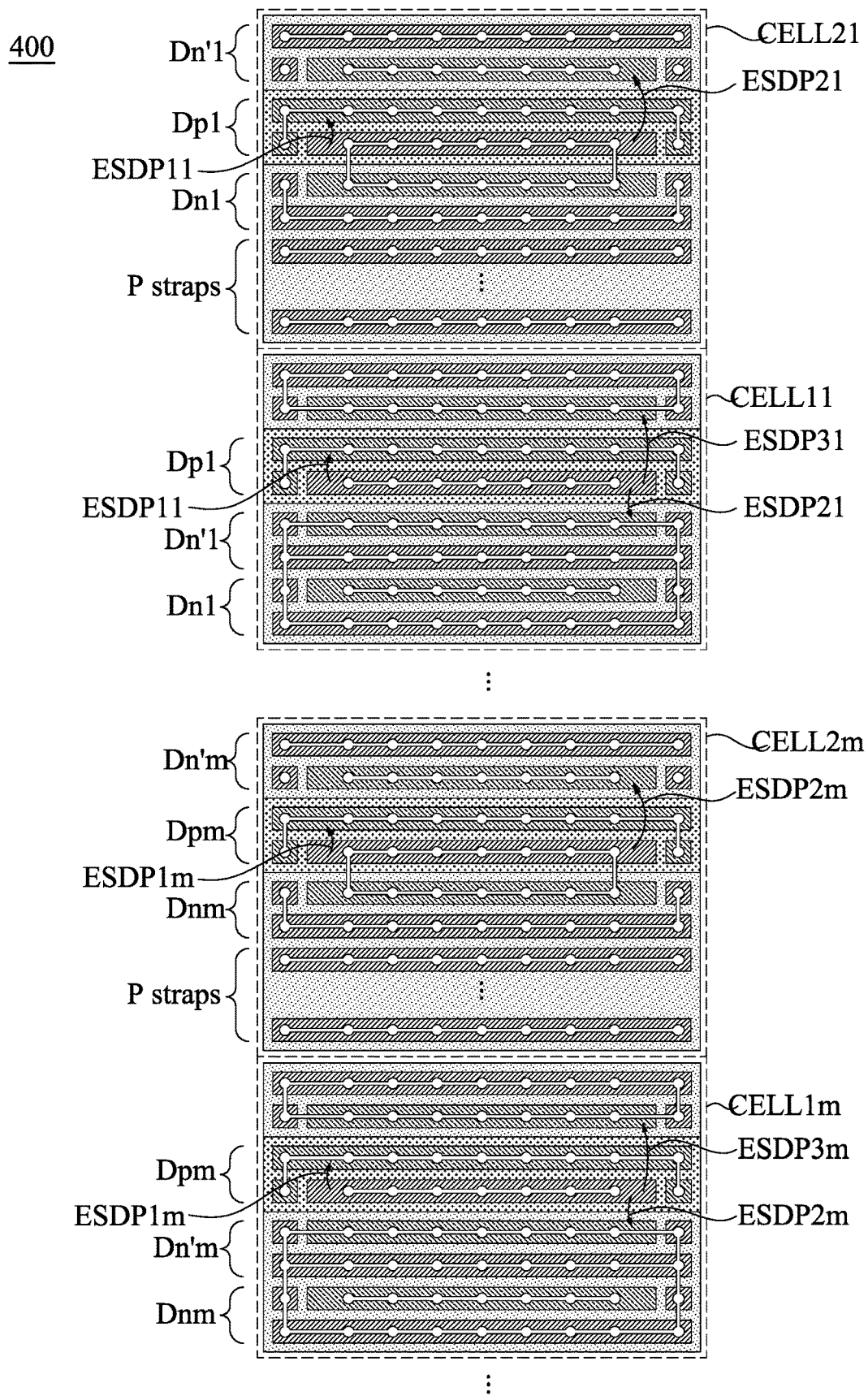

Reference is now made to FIG. 4D. FIG. 4D is layout diagram in a plan view of a semiconductor device 400 in accordance with various embodiments. For illustration, the semiconductor device 400 includes the ESD cells CELL11-CELL1*m* and the ESD cells CELL21-CELL2*m* in an array. As shown in FIG. 4D, the ESD cell CELL11 is adjacent to the ESD cell CELL21. The same configuration of the ESD cells CELL11 and CELL21 can be duplicated many times. However, the scope of the disclosure is not intended to be limited in the aforementioned arrangement of the array, and other suitable kinds of the arrangement of the array are within the contemplated scope of the present disclosure. For example, the numbers of plurality of the ESD cells CELL11-CELL1*m* and the plurality of the ESD cells CELL21-CELL2*m* included in the array can be modified as needed depending on the current capabilities desired for the semiconductor device 400.

Specifically illustrated in FIG. 4D, the semiconductor device 400 shown provides a plurality of ESD paths ESDP11-ESDP1*m* and a plurality of ESD paths ESDP21-ESDP2*m* in the ESD cells CELL21-CELL2*m*, a plurality of ESD paths ESDP11-ESDP1*m*, a plurality of ESD paths ESDP21-ESDP2*m*, and a plurality of ESD paths ESDP31-ESDP3*m* in the ESD cells CELL11-CELL1*m*. Alternatively stated, the ESD paths ESDP11-ESDP1*m* in the ESD cells CELL11-CELL1*m* and the ESD paths ESDP11-ESDP1*m* in the ESD cells CELL21-CELL2*m* are configured to cooperate to discharge a part of the ESD current IN between the I/O pad 110 and the voltage terminal VSS. The ESD paths ESDP21-ESDP2*m* in the ESD cells CELL11-CELL1*m* and the ESD paths ESDP21-ESDP2*m* in the ESD cells CELL21-CELL2*m* are configured to cooperate to discharge the other part of the ESD current IN through the semiconductor structures included in the diodes Dp1-Dp*m* and the diodes Dn'1-Dn'*m* in both of the ESD cells CELL11-CELL1*m* and the ESD CELL21-CELL2*m* cells. The ESD paths ESDP31-ESDP3*m* in the ESD cells CELL11-CELL1*m* are configured to cooperate to discharge the other part of the ESD current IN from the anodes of the diodes Dp1-Dp*m* in the ESD cells CELL11-CELL1*m* to the voltage terminal VSS. The semiconductor device 400 also provides the PNP paths P11-P1*m* in the ESD cells CELL21-CELL2*m* (which are not shown in FIG. 4D for the sake of brevity) cooperating to shunting a positive latchup current to the voltage terminal VSS.

The arrangements of the ESD cells CELL11-CELL1*m* and the ESD cells CELL21-CELL2*m* are given for illustrative purposes. Various configurations of the elements mentioned above are within the contemplated scope of the present disclosure. For example, in some embodiments, two adjacent of the ESD cells CELL11-CELL1*m* are disposed next to three of the ESD cell CELL21-CELL2*m*. Alternatively stated, in some embodiments, at least one of the plurality of the ESD cells CELL11-CELL1*m* and at least one of the plurality of the ESD cells CELL21-CELL2*m* are arranged in an array. The combination of the ESD cells CELL11-CELL1*m* and the ESD cells CELL21-CELL2*m* in the array can be modified according to the application.

In some embodiments, the semiconductor structures of the diodes Dp and Dn are designed be right adjacent to each other for further lowing the input parasitic capacitance of the semiconductor device in the present disclosure, but the present disclosure is not limited thereto.

Figure 5A:
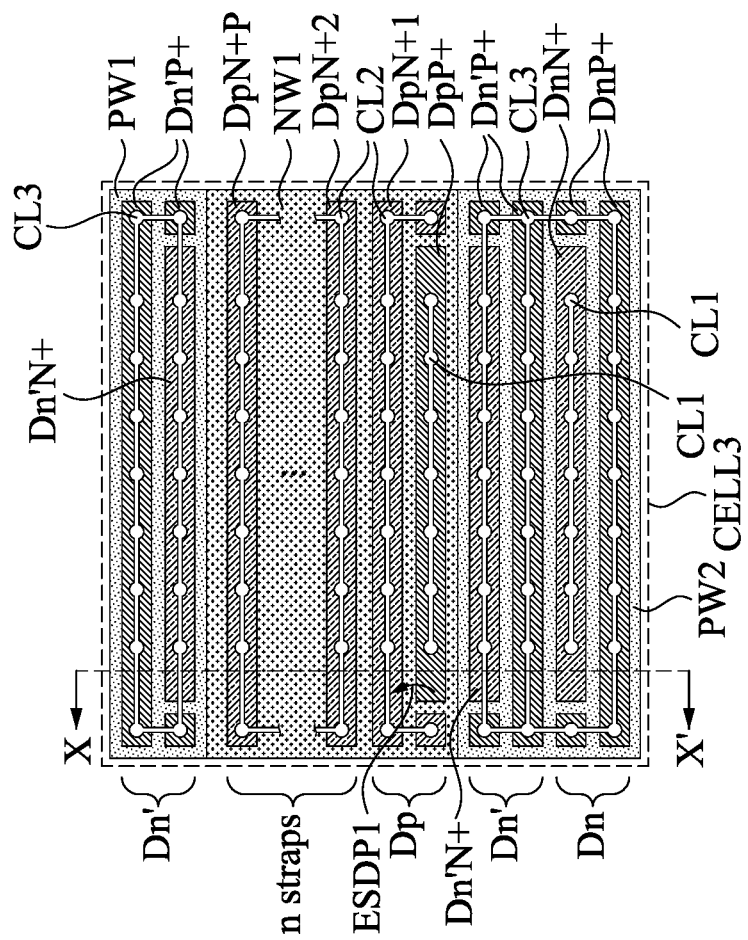
FIG. 5A is a layout diagram in a plan view of a section of a semiconductor device.
Figure 5B:
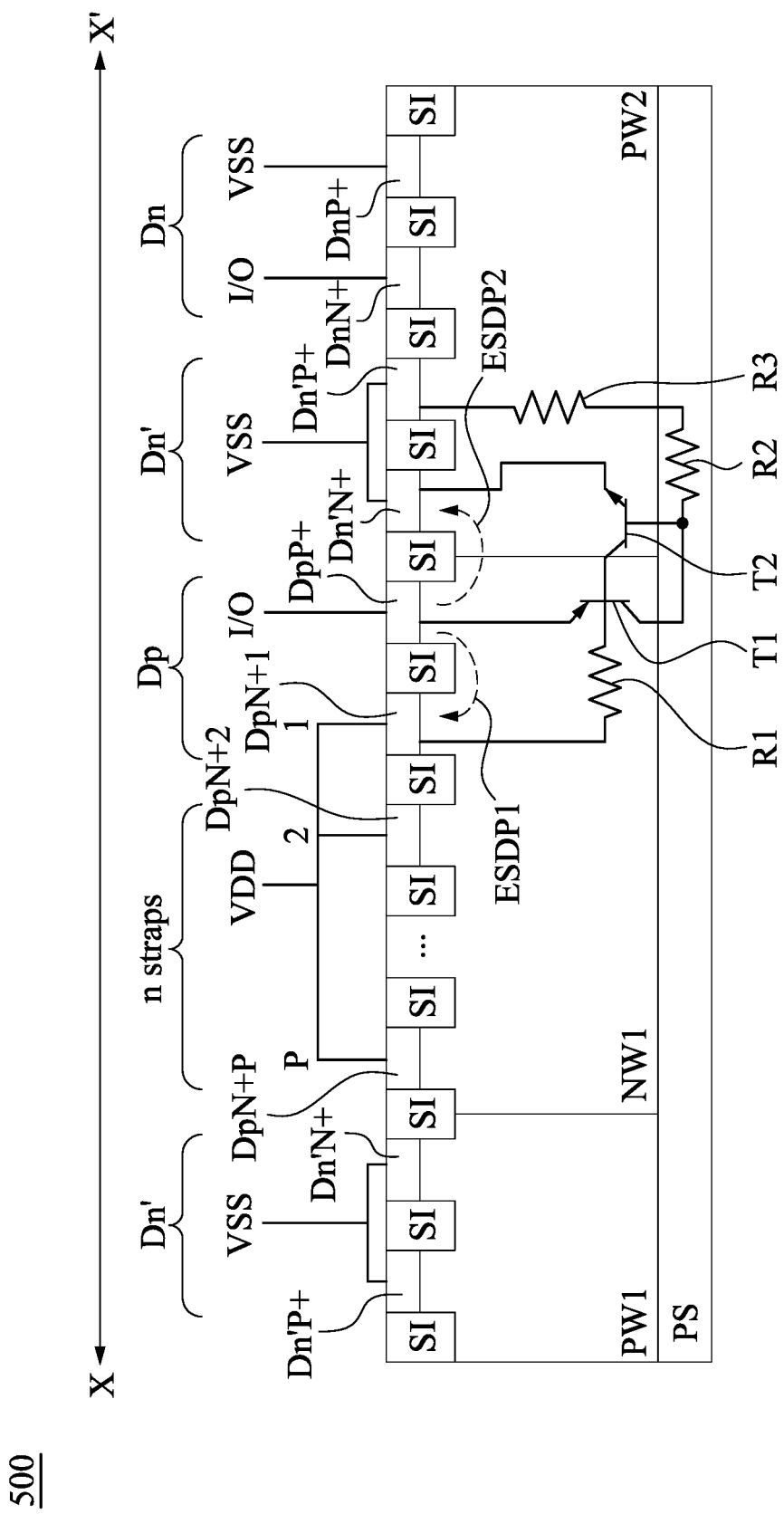
FIG. 5B and FIG. 5C are cross-sectional views of the layout diagram of the semiconductor device in FIG. 5A, in accordance with various embodiments.
Figure 5C:
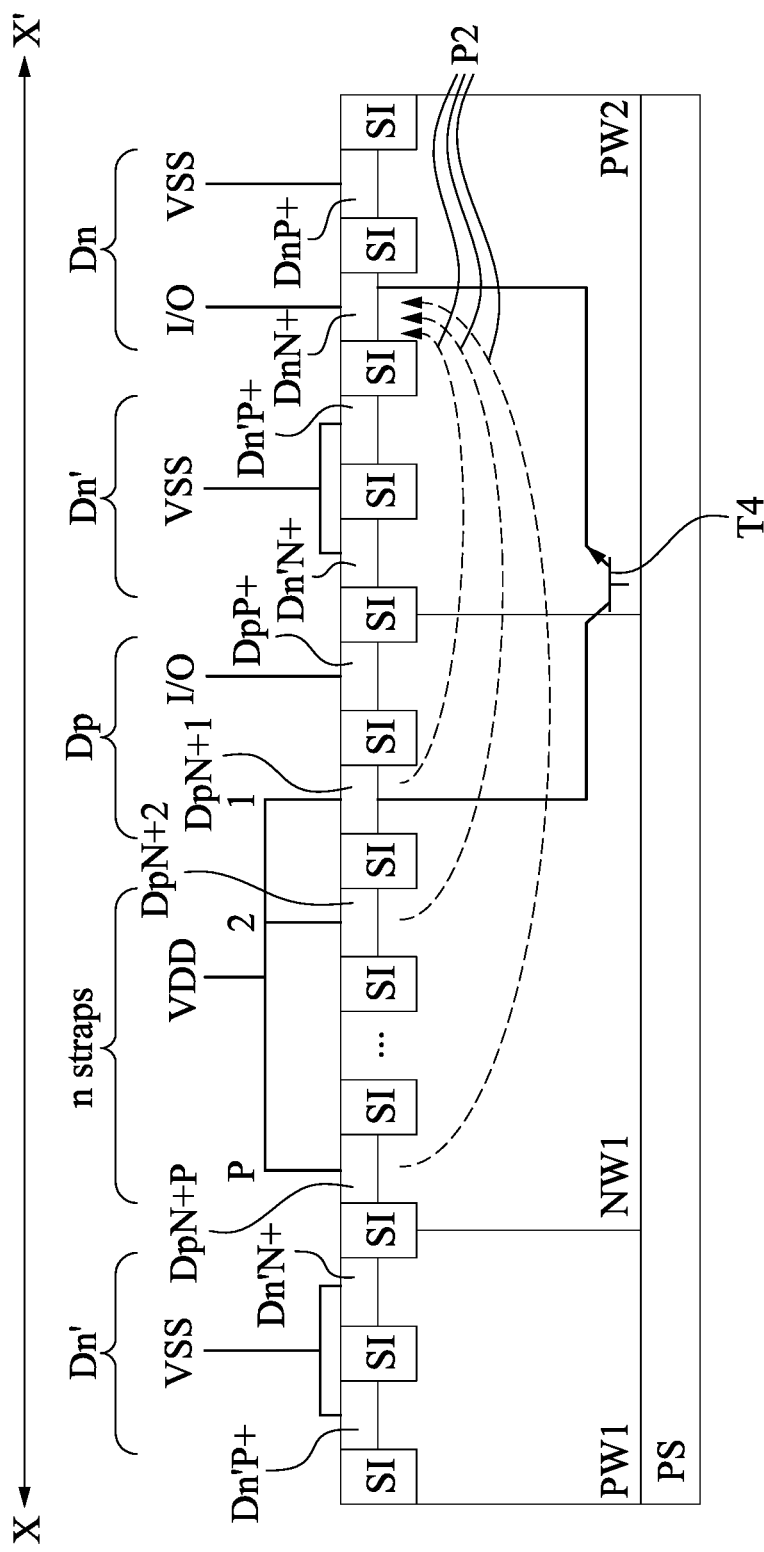

Reference is now made to FIG. 5A, FIG. 5B and FIG. 5C. FIG. 5A is a layout diagram in a plan view of a section of a semiconductor device 500, and FIG. 5B and FIG. 5C are cross-sectional views of the semiconductor device 500 in FIG. 5A along line XX', in accordance with various embodiments. With respect to the embodiments of FIG. 5A, FIG. 5B and FIG. 5C, like elements in FIG. 2A and FIG. 2B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5A, FIG. 5B and FIG. 5C.

Compared to the embodiment shown in FIG. 2A and FIG. 2B, for illustration, in the embodiments shown in FIG. 5A and FIG. 5B, a plurality of N+ doped regions DpN+1-DpN+p (each having a strap configuration as shown in FIG. 5A) arranged along the direction of line XX' in the N-well NW1. The region DpN+1 is configured as the cathode of the diode Dp. Each region of the N+ doped region DpN+1-DpN+p is coupled to the voltage terminal VDD via the VDD metal connection layers CL2 disposed thereon. In some embodiments, the aforementioned diodes Dn', Dp and Dn and at least part of the semiconductor structure as discussed above are configured to be formed as a ESD cell CELL3 as shown in FIG. 5A.

With the semiconductor structure as discussed above with respect to FIG. 5C, a parasitic NPN transistor T4 is formed and coupled as shown in FIG. 5C. For illustration, the region DnN+ is configured as an emitter of the parasitic NPN transistor T4 to be coupled to the I/O pad 110, the P-well PW2 is configured as a base of the parasitic NPN transistor T4, and the regions DpN+1-DpN+p are configured as a collector of the parasitic NPN transistor T4. The parasitic NPN transistor T4 is configured to form a NPN path P2 for shunting a negative latchup current to the voltage terminal VDD. For example, in some embodiments, a negative noise occurs at the I/O pad 110 and the extra electrons are injected into the diode Dn at the region DnN+(the arrow of the NPN path indicates the direction of the current while the electrons flow in a reverse direction). Subsequently, the latchup electrons flow through the region DnN+, the P-well PW2, and the N-well NW2, the regions DpN+1-DpN+p to the voltage terminal VDD which, in some embodiments, is coupled to a ground voltage.

Figure 5D:
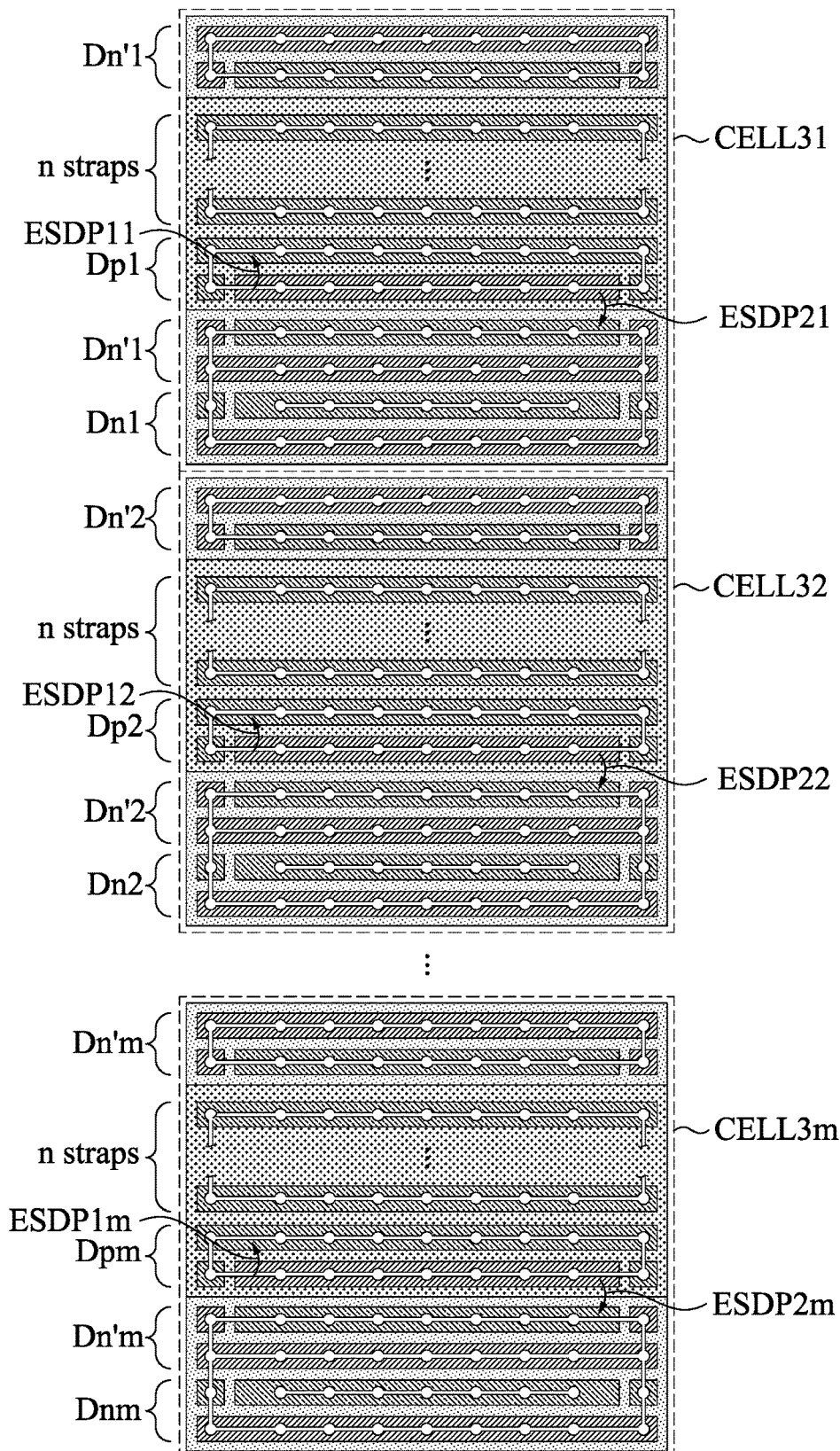
FIG. 5D and FIG. 5E are layout diagrams in a plan view of the semiconductor device in accordance with various embodiments.

Reference is now made to FIG. 5D. FIG. 5D is a layout diagram in a plan view of the semiconductor device 500 in accordance with various embodiments. For illustration, the semiconductor device 500 includes a plurality of ESD cells CELL31-CELL3*m* in an array. Each one cell of the ESD cells CELL31-CELL3*m* has the same configuration with the ESD cell CELL3 in the embodiment shown in FIG. 5A. As shown in FIG. 5D, the ESD cell CELL32 is adjacent to the ESD cell CELL31, the ESD cell CELL33 is adjacent to the ESD cell CELL32, and so on. However, the scope of the disclosure is not intended to be limited in the aforementioned arrangement of the plurality of the ESD cells, and other suitable kinds of the arrangement of the array are within the contemplated scope of the present disclosure. For example, the number of the ESD cells included in the array can be modified as needed depending on the current capabilities desired for the semiconductor device 500.

Specifically illustrated in FIG. 5D, the semiconductor device 500 shown provides a plurality of ESD paths ESDP11-ESDP1*m*, and a plurality of ESD paths ESDP21-ESDP2*m* offered by the ESD cells CELL31-CELL3*m*. In some embodiments, each one of the ESD paths ESDP11-ESDP1*m* has the same configuration with the ESD path ESDP1 in the embodiment shown in FIG. 2A and FIG. 2B. In like manner, each one of the ESD paths ESDP21-ESDP2*m* has the same configuration with the ESD path ESDP2. Alternatively stated, the ESD paths ESDP11-ESDP1*m* are configured to cooperate to discharge a part of the ESD current IN between the I/O pad 110 and the voltage terminal VSS. The ESD paths ESDP21-ESDP2*m* are configured to cooperate to discharge the other part of the ESD current IN through the semiconductor structures included in the diodes Dp1-Dp*m* and the diodes Dn'1-Dn'*m*. The semiconductor device 500 also provides a plurality of NPN paths P21-P2*m* (which are not shown in FIG. 5D for the sake of brevity) cooperating to shunting the negative latchup current to the voltage terminal VDD.

Figure 5E:
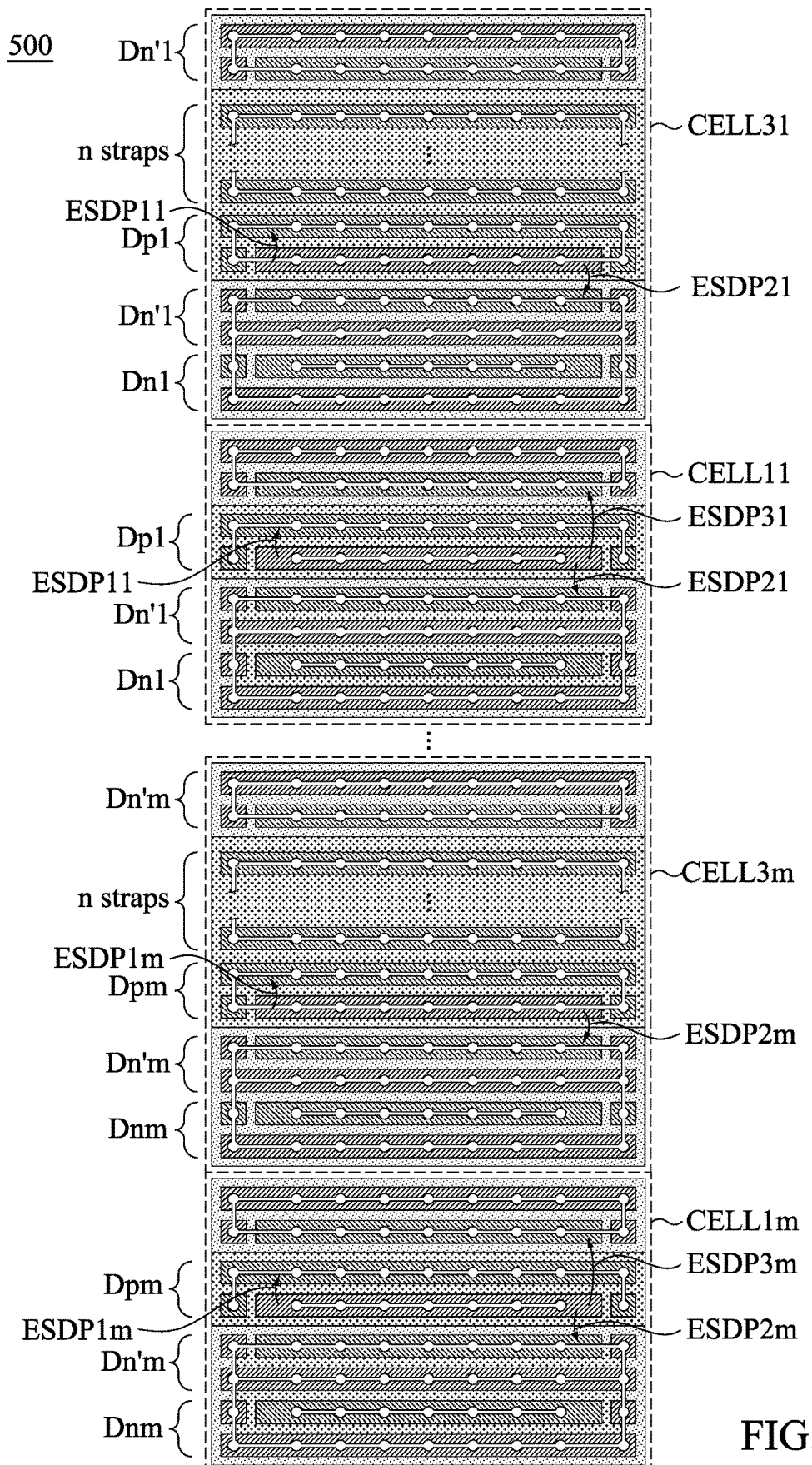

Reference is now made to FIG. 5E. FIG. 5E is layout diagram in a plan view of a semiconductor device 500 in accordance with various embodiments. For illustration, the semiconductor device 500 includes the plurality of ESD cells CELL31-CELL3*m* and the plurality of ESD cells CELL11-CELL1*m* in an array. As shown in FIG. 5E, the ESD cell CELL11 is adjacent to the ESD cell CELL31. The same configuration of the ESD cells CELL11 and CELL31 can be duplicated many times. However, the scope of the disclosure is not intended to be limited in the aforementioned arrangement of the array, and other suitable kinds of the arrangement of the array are within the contemplated scope of the present disclosure. For example, the numbers of plurality of the ESD cells CELL11-CELL1*m* and the plurality of the ESD cells CELL31-CELL3*m* included in the array can be modified as needed depending on the current capabilities desired for the semiconductor device 500.

Specifically illustrated in FIG. 5E, the semiconductor device 500 shown provides the plurality of ESD paths ESDP11-ESDP1*m* and the plurality of ESD paths ESDP21-ESDP2*m* in the ESD cells CELL31-CELL3*m*, the plurality of ESD paths ESDP11-ESDP1*m*, the plurality of ESD paths ESDP21-ESDP2*m*, and the plurality of ESD paths ESDP31-ESDP3*m* in the ESD cells CELL11-CELL1*m*. Alternatively stated, the ESD paths ESDP11-ESDP1*m* in the ESD cells CELL31-CELL3*m* and the ESD paths ESDP11-ESDP1*m* in the ESD cells CELL11-CELL1*m* are configured to cooperate to discharge a part of the ESD current IN between the I/O pad 110 and the voltage terminal VSS. The ESD paths ESDP21-ESDP2*m* in the ESD cells CELL31-CELL3*m* and the ESD paths ESDP21-ESDP2*m* in the ESD cells CELL11-CELL1*m* are configured to cooperate to discharge the other part of the ESD current IN through the semiconductor structures included in the diodes Dp1-Dp*m* and the diodes Dn'1-Dn'*m* in both of the ESD cells CELL31-CELL3*m* and the ESD cells CELL11-CELL1*m*. The ESD paths ESDP31-ESDP3*m* in the ESD cells CELL11-CELL1*m* are configured to cooperate to discharge the other part of the ESD current IN from the anodes of the diodes Dp1-Dp*m* in the ESD cells CELL11-CELL1*m* to the voltage terminal VSS. The semiconductor device 500 also provides the NPN paths P21-P2*m* in the ESD cells CELL31-CELL3*m* (which are not shown in FIG. 5E for the sake of brevity) cooperating to shunting a negative latchup current to the voltage terminal VSS.

The arrangements of the ESD cells CELL11-CELL1*m* and the ESD cells CELL31-CELL3*m* are given for illustrative purposes. Various configurations of the elements mentioned above are within the contemplated scope of the present disclosure. For example, in some embodiments, the ESD cells CELL31-CELL3*m* are formed in the semiconductor device 500 with the ESD cells CELL21-CELL2*m*.

Figure 6:
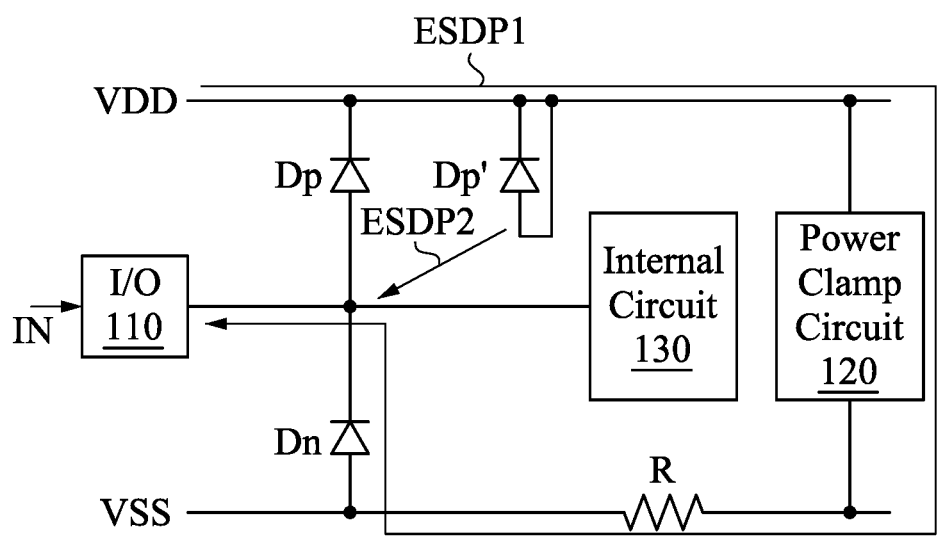
FIG. 6 is an equivalent circuit of part of a semiconductor device, in accordance with various embodiments.

Reference is now made to FIG. 6. FIG. 6 is an equivalent circuit of part of a semiconductor device 600, in accordance with various embodiments. With respect to the embodiments of FIG. 6, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 6.

Compared to the FIG. 1, as shown in FIG. 6, the semiconductor device 600 does not include the diode Dn'. The semiconductor device 600 includes a diode Dp'. An anode and a cathode of the diode Dp' are configured to receive the supply voltage SVDD. In some embodiments, the supply voltage SVDD is a ground voltage.

With continued reference to FIG. 6, during an ESD negative-to-VDD (hereinafter referred to as "ND mode") or negative electrostatic discharged event, there is an instantaneous build-up of a substantial electrical negative potential at the I/O pad 110. The diode Dn and the power clamp circuit 120 are turned on to further trigger the SCR circuit formed, including, the diodes Dn and Dp'. For illustration, multiple ESD paths, including, for example, ESDP1, ESDP2 as shown in FIG. 6 are conducted in the semiconductor device 600, for the ESD current IN to be discharged. Specifically, as shown in FIG. 6, one part of the ESD current IN flows between the I/O pad 110 and the voltage terminal VDD and is directed through the ESD path ESDP1 which is formed by the diode Dn, the resistance R and the power clamp circuit 120. Another part of the ESD current IN flows between the I/O pad 110 and the voltage terminal VDD and is directed through the ESD path ESDP2 in which the diode Dn and the diode Dp' include a semiconductor structure configured to discharge part of the ESD current IN. Details of the semiconductor structure included in the diode Dp' and the diode Dn are discussed below.

Figure 7A:
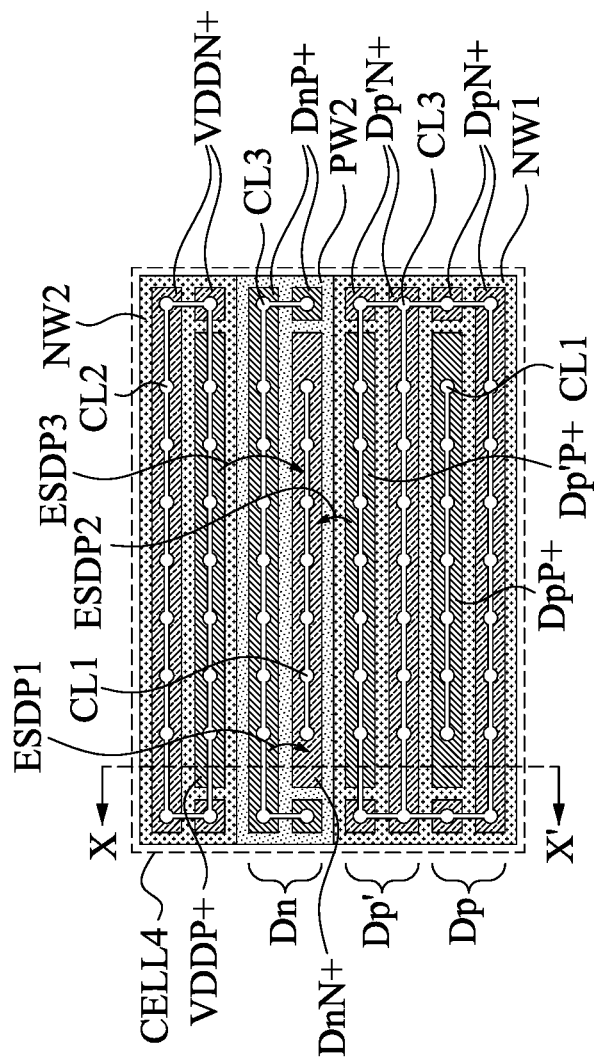
FIG. 7A is a layout diagram in a plan view of a section of the semiconductor device in FIG. 6 in accordance with some embodiments.
Figure 7B:
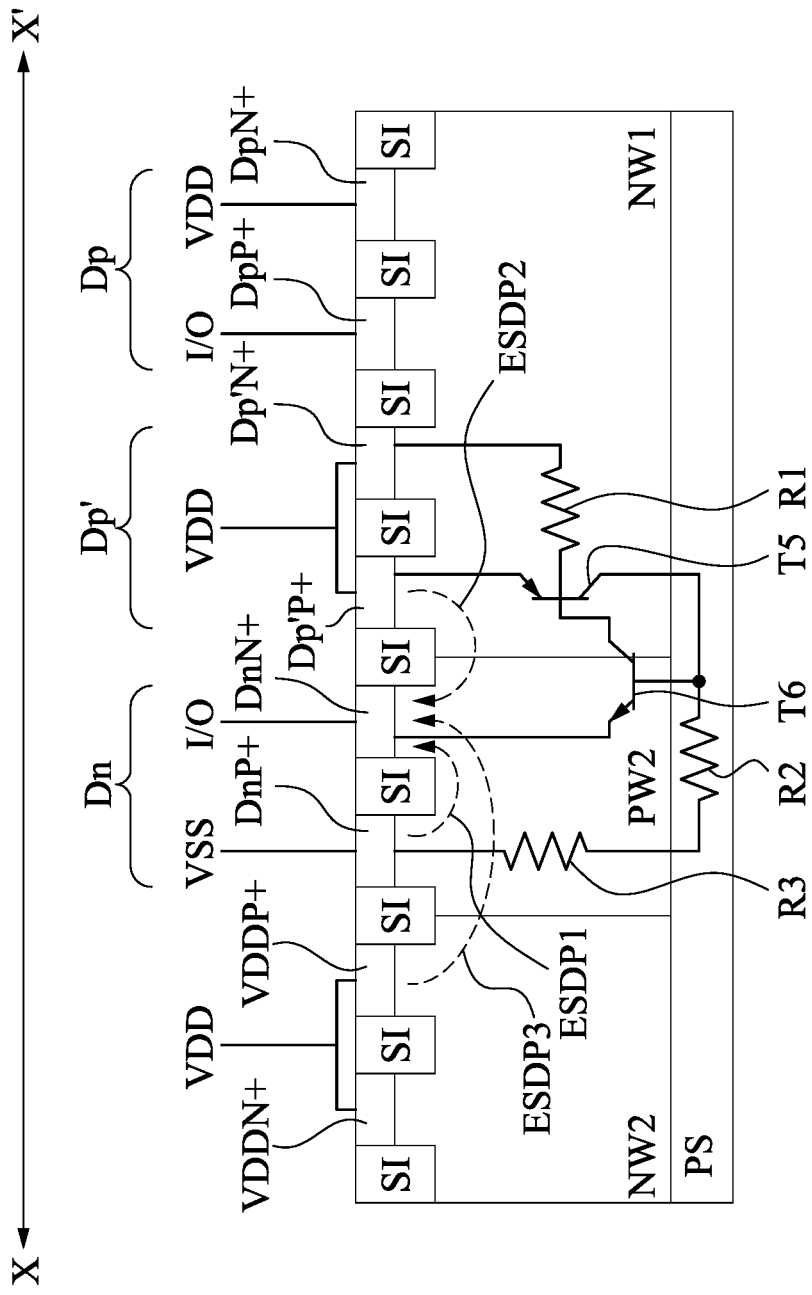
FIG. 7B is a cross-sectional view of the layout diagram of the semiconductor device in FIG. 7A, in accordance with various embodiments.

For further understanding the structure of the semiconductor device 600 shown in the embodiment in FIG. 6, reference is now made to FIG. 7A and FIG. 7B. FIG. 7A is a layout diagram in a plan view of a section of the semiconductor device 600 in FIG. 6 in accordance with some embodiments. FIG. 7B is a cross-sectional view of the layout diagram of the semiconductor device in FIG. 7A along line XX', in accordance with various embodiments. With respect to the embodiments of FIG. 7A and FIG. 7B, like elements in FIG. 2A and FIG. 2B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 7A and FIG. 7B.

Compared with the embodiments in FIG. 2A and FIG. 2B, as shown in FIG. 7A and FIG. 7B, the semiconductor device 600 further includes an N-well NW2 that is disposed next to the P-well PW2 on the P-type substrate PS, the diode Dp',i in which the VDD metal connection layer CL2 is further disposed on the diode Dp'. In the embodiment as shown in FIG. 7A, the N-well NW1, the N-well NW2, the P-well PW2, the diodes Dp, Dp' and Dn and at least part of the semiconductor structure as discussed above are configured to be formed as an ESD cell CELL4, as shown in FIG. 7A. However, the scope of the disclosure is not intended to be limited in this kind of the ESD cell, and other suitable kinds of the ESD cell are within the contemplated scope of the present disclosure. For example, the width, the length of the doped regions, the spaces between the doped regions and the arrangement of the connection layers can be modified as needed depending on the current capabilities desired for the semiconductor device 600. For simplicity of illustration, the I/O pad metal connection layers CL1, the VDD metal connection layers CL2, and the VSS metal connection layers CL3 are not shown in FIG. 7B.

Compared with the embodiments in FIG. 2B, for illustration, as shown in FIG. 7B, the diode Dp' includes a P+ doped region Dp'P+ and an N+ doped region Dp'N+ formed in the N-well NW1. The region Dp'P+ is configured as the anode of the diode Dp'. The region Dp'N+ is configured as the cathode of the diode Dp'. The regions Dp'P+ and Dp'N+ are configured to be coupled to the voltage terminal VDD to receive the supply voltage SVDD.

With the semiconductor structure as discussed above with respect to FIG. 7B, a parasitic PNP transistor T5, a parasitic NPN transistor T6, and the parasitic resistances R1, R2 and R3 are formed and coupled as shown in FIG. 7B. In some embodiments, the parasitic transistors T5, T6, and the parasitic resistances R1, R2 and R3 operate together as an equivalent silicon controlled rectifier (SCR) circuit. The equivalent SCR circuit shown in FIG. 7B is given for illustrative purposes. Various equivalent SCR circuits are within the contemplated scope of the present disclosure. For example, in various embodiments, at least one of the parasitic resistance R1, R2, or R3 is omitted.

The parasitic PNP transistor T5 includes the P+ doped region Dp'P+ as an emitter, the N-well NW1 as a base, and the P-type substrate PS as a collector. The base of the PNP transistor T5 is coupled to the N+ doped region Dp'N+ through the parasitic resistor R1. The collector of the PNP transistor T5 is coupled to the P+ region DnP+ through the parasitic resistances R2 and R3. The parasitic NPN transistor T6 includes the N-well NW1 as a collector, the P-well PW2 as a base, and the N+ doped region DnN+ as an emitter. The collector of the NPN transistor T6 is coupled to the base of the PNP transistor T5. The base of the NPN transistor T6 is coupled to the P+ doped region DnP+ through the parasitic resistances R2 and R3.

With continued reference to FIG. 7B, for illustration, the semiconductor structure included in the diode Dp' and diode Dn is configured as the ESD path ESDP2 (also as shown in FIG. 6), and is configured to operate as the SCR circuit as discussed above. Alternatively stated, the region Dp'P+ of the diode Dp', the N-well NW1, the P-type substrate PS, the P-well PW2 and the regions DnN+ and DnP+ of the diode Dn are configured to operate as the SCR circuit. For example, in some embodiments, a part of the ESD current IN from the voltage terminal VDD flows through the regions Dp'N+ and Dp'P+ of the diode Dp', the N-well NW1, the P-type substrate PS, the P-well PW2, and the region DnN+ to the I/O pad 110 (the arrow of the ESD path ESDP2 indicates the direction of the ESD current IN while the electrons flow in a reverse direction).

In operation, during the ESD ND mode event, the diode Dn and the power clamp circuit 120 of FIG. 6 are turned on to further trigger the SCR circuit of FIG. 7B. Specifically as shown in FIG. 7B, at least part of the ESD current IN flows from the voltage terminal VSS, through the ESD path ESDP1 of FIG. 6 including the region DnP+ of the diode Dn, the P-well PW2, and the region DnN+ of the diode Dn to the I/O pad 110. Moreover, the parasitic PNP transistor T5 and the parasitic NPN transistor T6 are turned on during the ND mode. Thus, another part of the ESD current IN flows from the voltage terminal VDD, through the ESD path ESDP2 including the parasitic resistance R1, the PNP parasitic transistor T5, the parasitic resistance R2, and the parasitic NPN transistor T6 to the I/O pad 110 (the arrow of the ESD path ESDP2 indicates the direction of the ESD current IN while the electrons flow in a reverse direction).

In some embodiments, the semiconductor device 600 further includes VDDP+ and VDDN+ formed in the N-well NW2, as shown in FIG. 7B. For illustration, the region VDDP+ is doped with p-type dopants as discussed above. With the semiconductor structure including the region VDDP+ in the N-well NW2, an ESD path ESDP3 is also conducted in some embodiments. In various embodiments, the ESD path ESDP3 is also implemented with another equivalent SCR circuit which, for simplicity of illustration, is not shown in FIG. 7B. The other part of the ESD current IN flows from the voltage terminal VDD, through the ESD path ESDP3 including the region VDDP+, and the region DnN+ of the diode Dn, to the I/O pad 110.

The configurations of FIG. 7A and FIG. 7B are given for illustrative purposes. Various configurations of the elements mentioned above in FIG. 7A and FIG. 7B are within the contemplated scope of the present disclosure. For example, in various embodiments, the semiconductor structure including the N-well NW2 and the regions VDDP+ and VDDN+ is omitted.

Figure 8A:
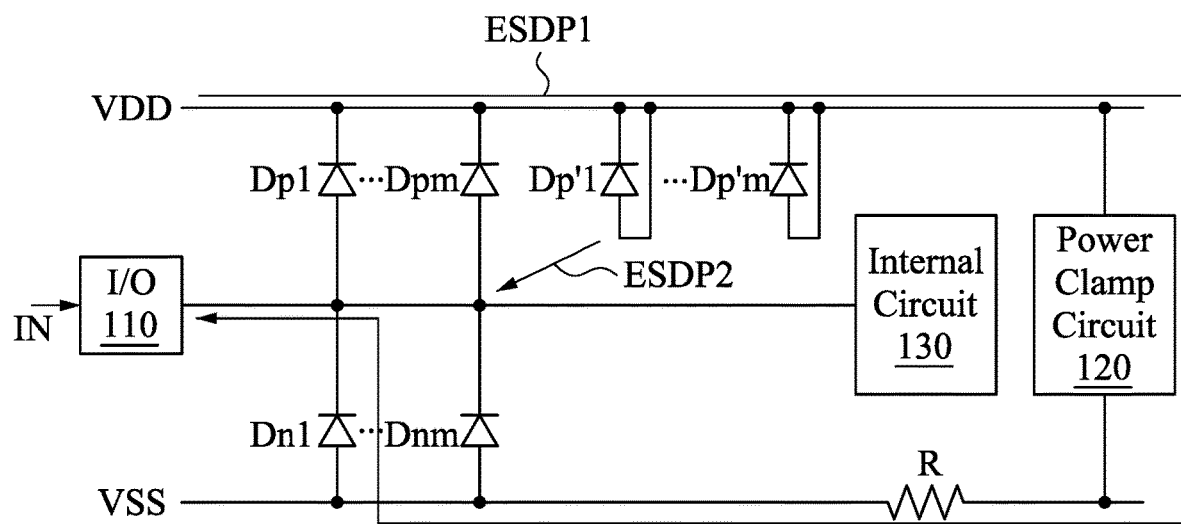
FIG. 8A is an equivalent circuit of part of a semiconductor device.

Reference is now made to FIG. 8A. FIG. 8A is an equivalent circuit of part of a semiconductor device 800 in accordance with various embodiments. With respect to the embodiments of FIG. 8A, like elements in FIG. 3A and FIG. 6 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8A.

Compared to the embodiments shown in FIG. 3A and FIG. 6, the semiconductor device 800 in the embodiment shown FIG. 8A further includes a plurality of diodes Dp'1-Dp'm coupled in parallel to the voltage terminal VDD, without including the plurality of the diodes Dn'1-Dn'm. Each of the diodes Dp'1-Dp'm is identical with the diode Dp'. Moreover, in some embodiments, the numbers of the plurality of the diodes Dp1-Dpm, the diodes Dn1-Dnm and the diodes Dp'1-Dp'm are different from each other. Alternatively stated, in some embodiments, the semiconductor device 800 includes at least one diode of the diodes Dp2-Dpm coupled to the diode Dp1, at least one diode of the diodes Dn2-Dnm coupled to the diode Dn1, and at least one diode of the diodes Dp'2-Dp'm coupled to the diode Dp'1.

Figure 8B:
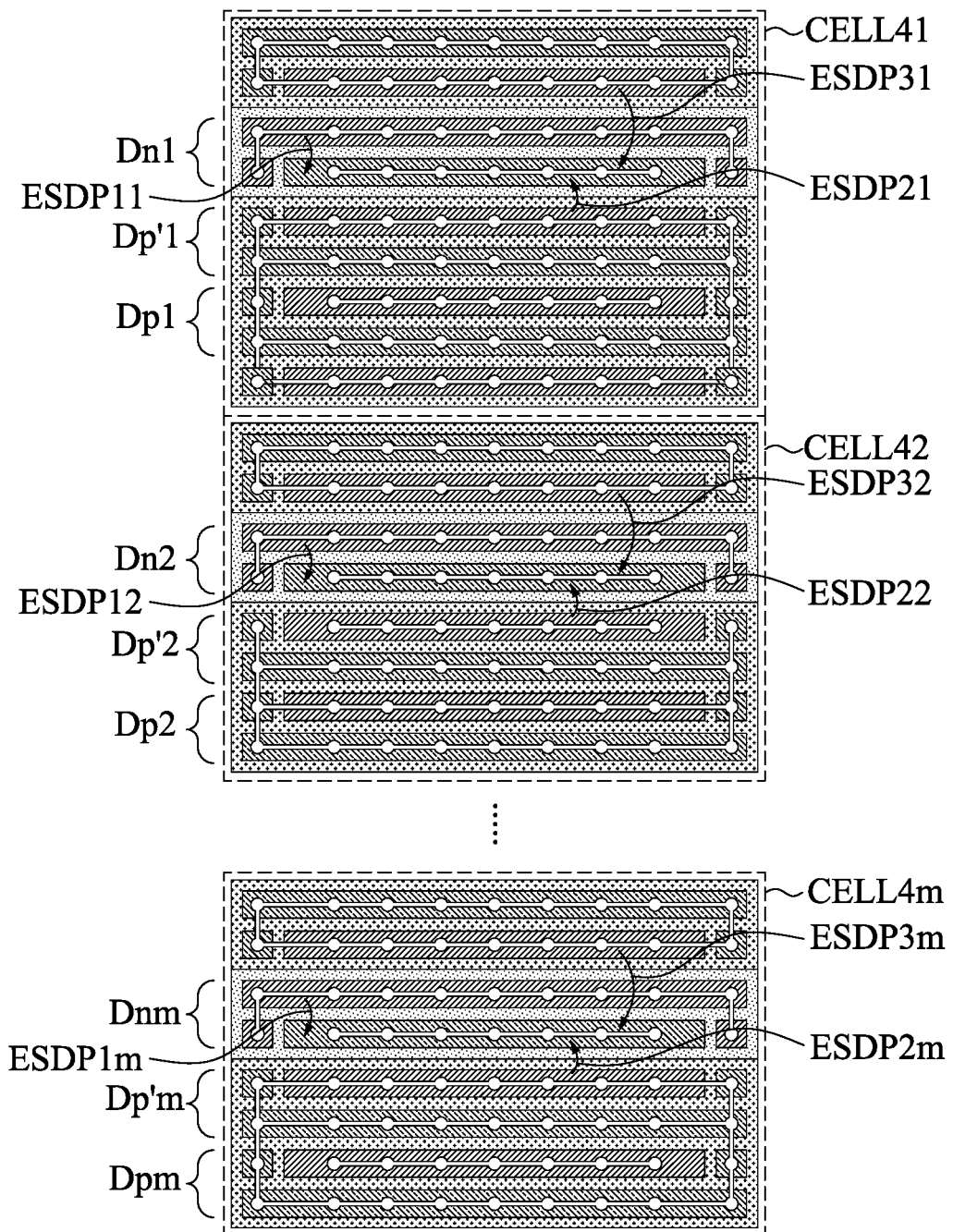
FIG. 8B is a layout diagram in a plan view of a section of the semiconductor device in FIG. 8A in accordance with some embodiments.

Reference is now made to FIG. 8B. FIG. 8B is a layout diagram in a plan view of a section of the semiconductor device 800 in FIG. 8A in accordance with some embodiments. For illustration, the semiconductor device 800 includes a plurality of ESD cells CELL41-CELL4m arranged in an array. Each one cell of the plurality of ESD cells CELL41-CELL4m has the same configuration with the ESD cell CELL4 in the embodiment shown in FIG. 7A. As shown in FIG. 8B, the ESD cell CELL42 is adjacent to the ESD cell CELL41, the ESD cell CELL43 is adjacent to the ESD cell CELL42, and so on. However, the scope of the disclosure is not intended to be limited in the aforementioned arrangement of the plurality of the ESD cells in the array, and other suitable kinds of the arrangement of the plurality of the ESD cells are within the contemplated scope of the present disclosure. For example, the number of the ESD cells included in the array can be modified as needed depending on the current capabilities desired for the semiconductor device 800.

Specifically illustrated in FIG. 8B, the semiconductor device 800 provides a plurality of ESD paths ESDP11-ESDP1m, a plurality of ESD paths ESDP21-ESDP2m, and a plurality of ESD paths ESDP31-ESDP3m offered by the ESD cells CELL41-CELL4m. In some embodiments, each one of the ESD paths ESDP11-ESDP1m has the same configuration with the ESD path ESDP1 in the embodiment shown in FIG. 7A and FIG. 7B. In like manner, each one of the ESD paths ESDP21-ESDP2m has the same configuration with the ESD path ESDP2, and each one of the ESD paths ESDP31-ESDP3m has the same configuration with the ESD path ESDP3. Alternatively stated, the ESD paths ESDP11-ESDP1m are configured to cooperate to discharge a part of the ESD current IN between the I/O pad 110 and the voltage terminal VDD. The ESD paths ESDP21-ESDP2m are configured to cooperate to discharge another part of the ESD current IN through the semiconductor structures included in the diodes Dn1-Dnm and the diodes Dp'1-Dp'm. The ESD paths ESDP31-ESDP3m are configured to cooperate to discharge the other part of the ESD current IN from the voltage terminal VDD to the anodes of the diodes Dn1-Dnm.

The configurations of the diodes Dp1-Dpm, Dn1-Dnm, and Dp'1-Dp'm, the ESD cells CELL41-CELL4m are given for illustrative purposes. Various configurations of the elements mentioned above are within the contemplated scope of the present disclosure. For example, in various embodiments, instead of being arranged in a column as shown in FIG. 8B, the ESD cells CELL41-CELL4m are arranged in a row or a matrix.

Figure 9A:
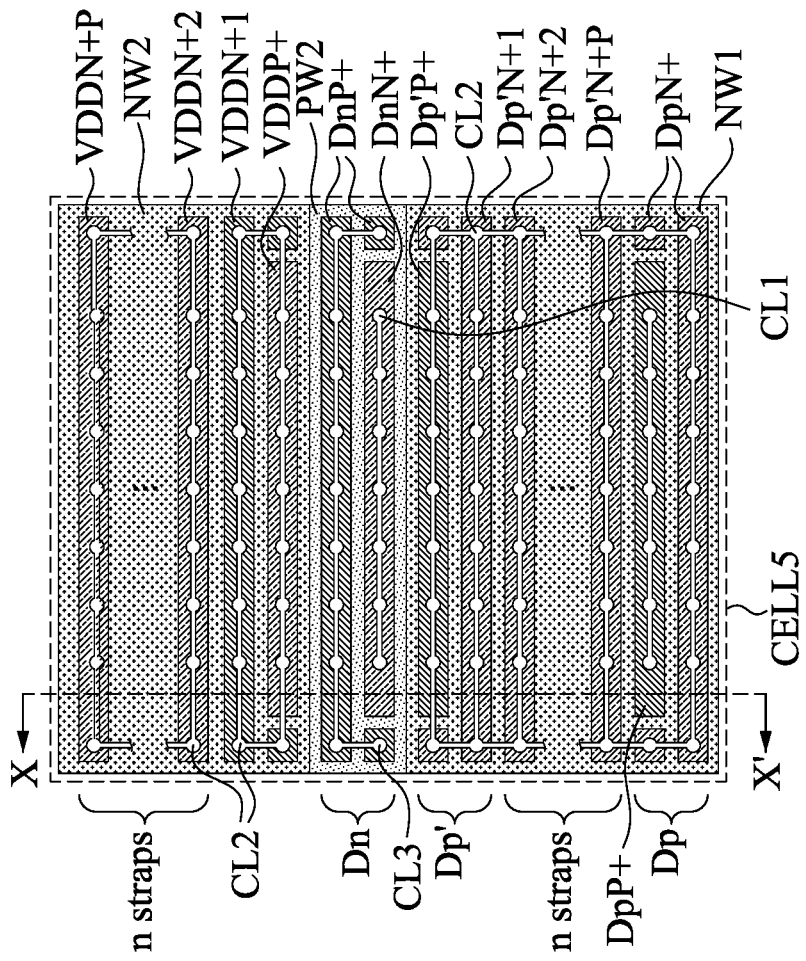
FIG. 9A is a layout diagram in a plan view of a section of the semiconductor device in FIG. 6 in accordance with some embodiments, with another arrangement of doped regions.
Figure 9B:
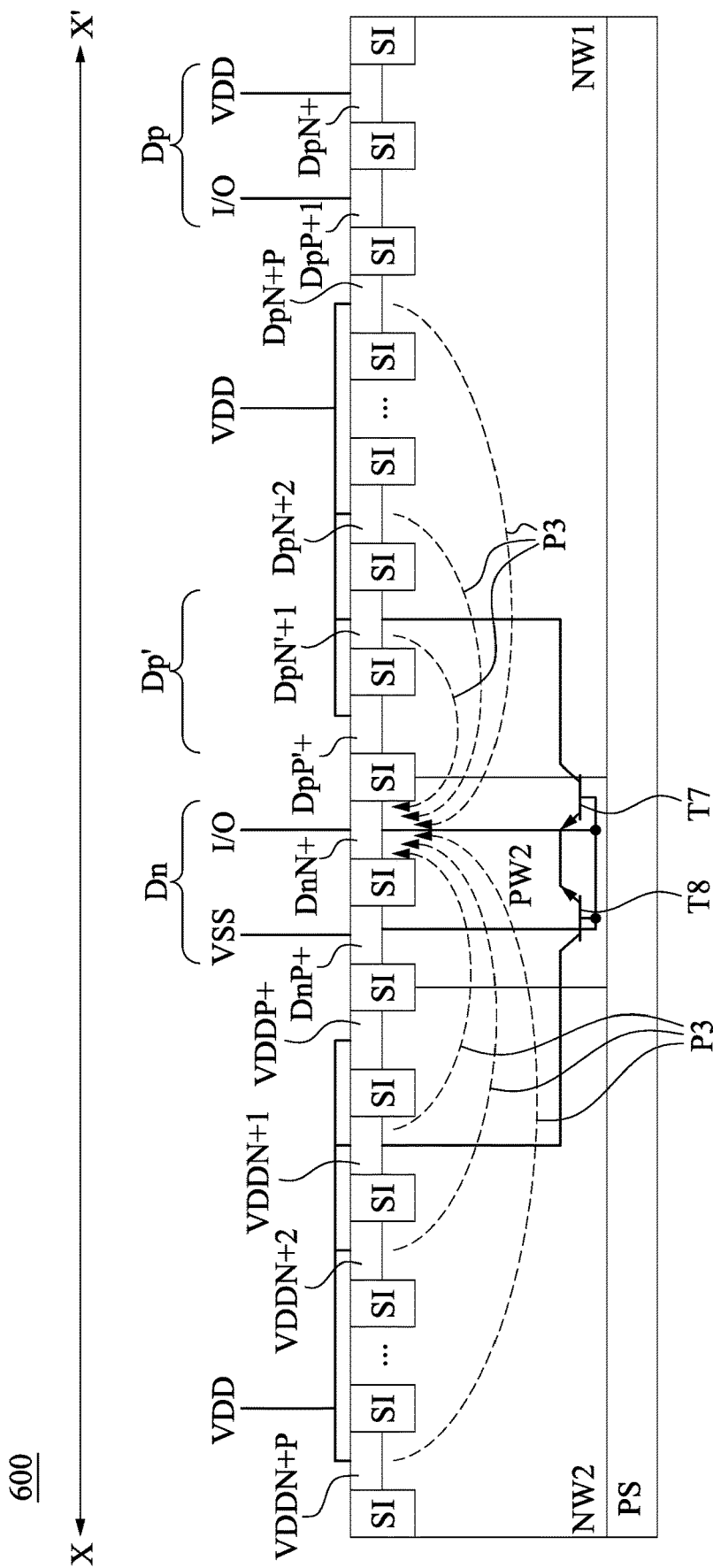
FIG. 9B is a cross-sectional view of the layout diagram of the semiconductor device in FIG. 9A, in accordance with various embodiments.

Reference is now made to FIG. 9A and FIG. 9B. FIG. 9A is a layout diagram in a plan view of a section of the semiconductor device 600 in FIG. 6 in accordance with some embodiments, with another arrangement of doped regions. FIG. 9B is a cross-sectional view of the layout diagram of the semiconductor device 600 in FIG. 9A cross line XX', in accordance with various embodiments. With respect to the embodiments of FIG. 9A and FIG. 9B, like elements in FIG. 7A and FIG. 7B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 9A and FIG. 9B.

Compared to the embodiment shown in FIG. 7A and FIG. 7B, for illustration, in the embodiments shown in FIG. 9A and FIG. 9B, a plurality of N+ doped regions Dp'N+1-Dp'N+p (each having a strap configuration as shown in FIG. 9A) arranged along the direction of line XX' in the N-well NW1. The region Dp'N+1 is configured as the cathode of the diode Dp'. Each region of the N+ doped regions Dp'N+1-Dp'N+p is coupled to the voltage terminal VDD via the VDD metal connection layers CL2 disposed thereon. In some embodiments, the aforementioned diodes Dp', Dp and Dn and at least part of the semiconductor structure as discussed above are configured to be formed into a ESD cell CELL5 as shown in FIG. 7A. It should be noted that, in some embodiments, there are a plurality of N+ doped regions VDDN+1-VDDN+p disposed next to the region VDDP+ in the N-well NW2. Each region of the N+ doped regions VDDN+1-VDDN+p is coupled to the voltage terminal VDD via the VDD metal connection layers CL2 disposed thereon.

With the semiconductor structure as discussed above with respect to FIG. 9B, parasitic transistors T7 and T8 are formed and coupled as shown in FIG. 9B. For illustration, the region DnN+ is configured as emitters of the parasitic transistors T7 and T8 to be coupled to the I/O pad 110. The P-well PW2 is configured as bases of the parasitic transistors T7 and T8. The plurality of the regions Dp'N+1-Dp'N+p are configured as a collector of the transistor T7. The plurality of the regions VDDN+1-VDDN+p are configured as a collector of the transistor T8. The bases of the parasitic transistors T7 and T8 are coupled to the voltage terminal VSS through the region DnP+.

For illustration, the parasitic transistors T7 and T8 are configured to form NPN paths P3 for shunting a negative latchup current to the voltage terminal VDD. For example, in some embodiments, a negative noise occurs at the I/O pad 110 and the extra electrons are injected into the diode Dn at the region DnN+(the arrow of the NPN path indicates the direction of the current while the electrons flow in a reverse direction). Subsequently, the latchup electrons flow from the region DnN+, the P-well PW2, the N-wells NW1 and NW2, the regions Dp'N+1-Dp'N+p and the plurality of the regions VDDN+1-VDDN+p, through the NPN paths P3, to the voltage terminal VDD which, in some embodiments, is coupled to a ground voltage.

Figure 9C:
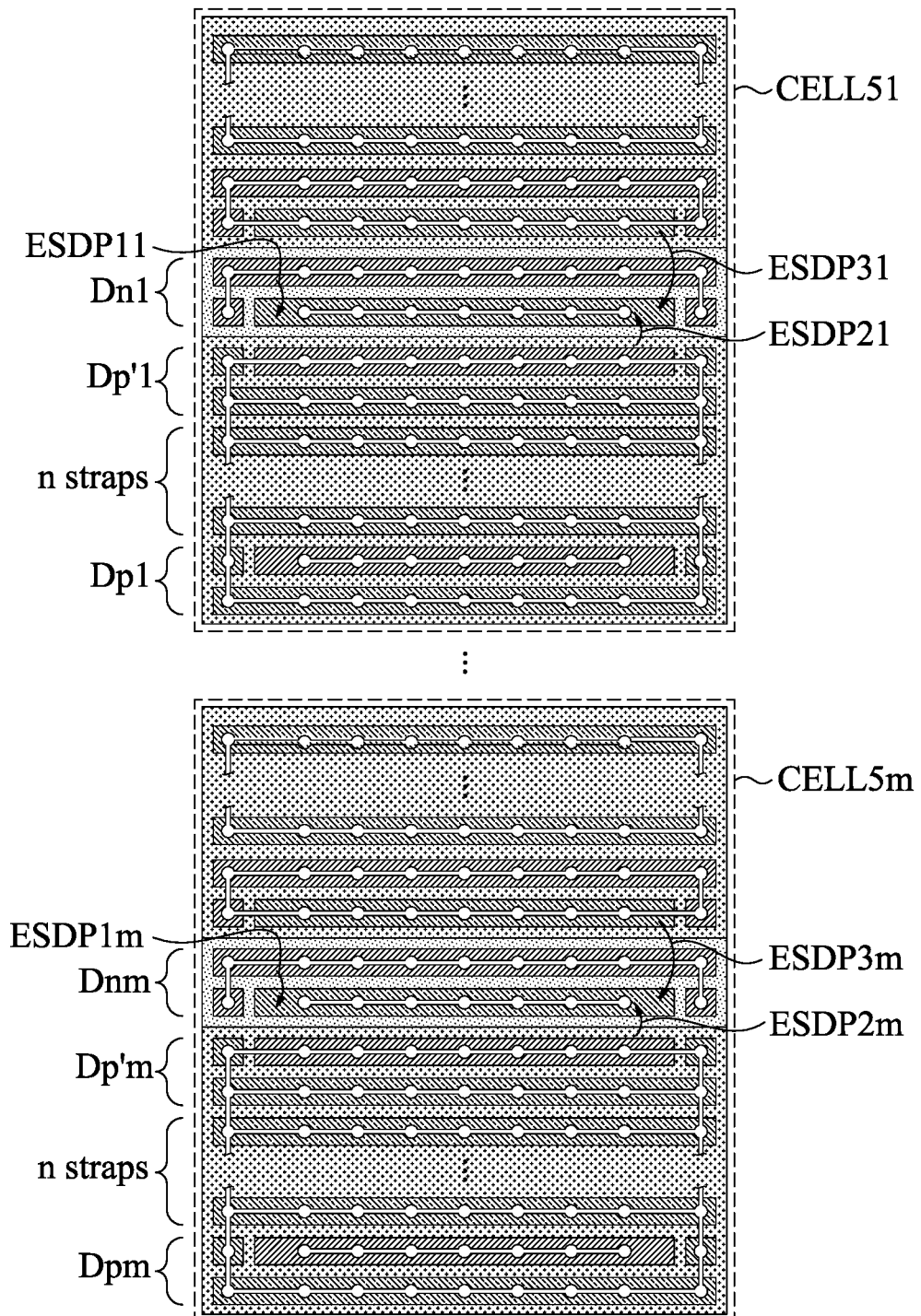
FIG. 9C and FIG. 9D are layout diagrams in a plan view of the semiconductor device in FIG. 9A in accordance with some embodiments.
Figure 9D:
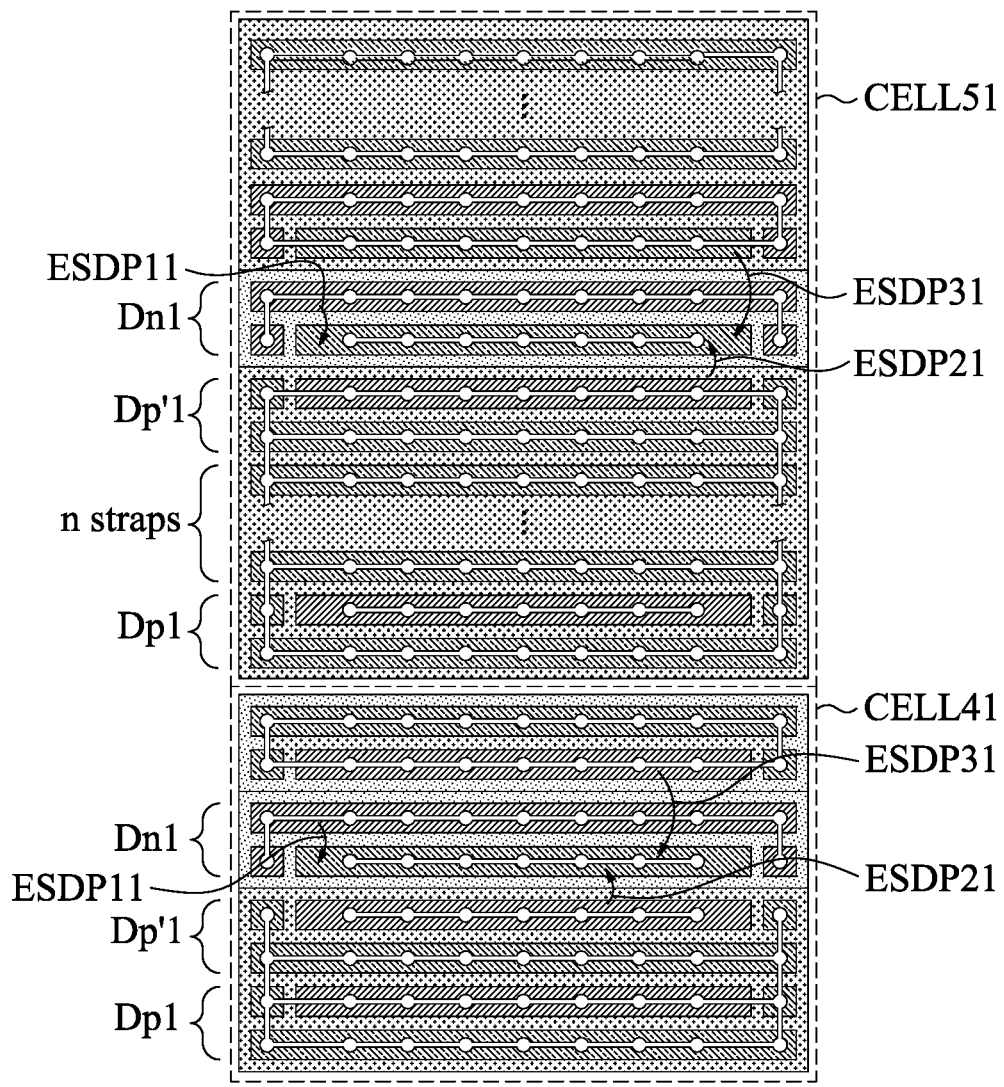

Reference is now made to FIG. 9C and FIG. 9D. FIG. 9C and FIG. 9D are layout diagrams in a plan view of the semiconductor device 600 in FIG. 9A in accordance with some embodiments. For illustration, the semiconductor device 600 includes a plurality of ESD cells CELL51-CELL5m in an array. Each one cell of the ESD cells CELL51-CELL5m has the same configuration with the ESD cell CELL5 in the embodiment shown in FIG. 9A. As shown in FIG. 9C, one of the ESD cells CELL51-CELL5m is disposed adjacent to another one of the ESD cells CELL51-CELL5m. However, the scope of the disclosure is not intended to be limited in the aforementioned arrangement of the array, and other suitable kinds of the arrangement of the array are within the contemplated scope of the present disclosure. For example, the number of the ESD cells included in the array can be modified as needed depending on the current capabilities desired for the semiconductor device 600.

With continued reference to FIG. 9C, the semiconductor device 600 provides a plurality of ESD paths ESDP11-ESDP1m, a plurality of ESD paths ESDP21-ESDP2m, and a plurality of ESD paths ESDP31-ESDP3m offered by the ESD cells CELL51-CELL5m. In some embodiments, each one of the ESD paths ESDP11-ESDP1m has the same configuration with the ESD path ESDP1 in the embodiment shown in FIG. 7A and FIG. 7B. In like manner, each one of the ESD paths ESDP21-ESDP2m has the same configuration with the ESD path ESDP2, and each one of the ESD paths ESDP31-ESDP3m has the same configuration with the ESD path ESDP3. Alternatively stated, the ESD paths ESDP11-ESDP1m are configured to cooperate to discharge a part of the ESD current IN between the I/O pad 110 and the voltage terminal VDD. The ESD paths ESDP21-ESDP2m are configured to cooperate to discharge another part of the ESD current IN through the semiconductor structures included in the diodes Dn1-Dnm and the diodes Dp'1-Dp'm. The ESD paths ESDP31-ESDP3m are configured to cooperate to discharge the other part of the ESD current IN from the anodes of the diodes Dn1-Dnm to the voltage terminal VDD. The semiconductor device 600 also provides a plurality of NPN paths P31-P3m (which are not shown in FIG. 9C for the sake of brevity) cooperating to shunting the negative latchup current to the voltage terminal VDD.

The configurations of FIGS. 9A-9C are given for illustrative purposes. Various configurations of the elements mentioned above are within the contemplated scope of the present disclosure.

Reference is now made to FIG. 9D. FIG. 9D is layout diagram in a plan view of the semiconductor device 600 in accordance with various embodiments. For illustration, the semiconductor device 600 includes the ESD cells CELL41-CELL4m and the ESD cells CELL51-CELL5m in an array. As shown in FIG. 9D, the ESD cell CELL41 is adjacent to the ESD cell CELL51. The same configuration of the ESD cells CELL41 and CELL51 can be duplicated many times. However, the scope of the disclosure is not intended to be limited in the aforementioned arrangement of the array, and other suitable kinds of the arrangement of the array are within the contemplated scope of the present disclosure. For example, the numbers of plurality of the ESD cells CELL41-CELL4m and the plurality of the ESD cells CELL51-CELL5m included in the array can be modified as needed depending on the current capabilities desired for the semiconductor device 600.

Specifically illustrated in FIG. 9D, the semiconductor device 600 provides the ESD paths ESDP11-ESDP1m, the ESD paths ESDP21-ESDP2m, and the ESD paths ESDP31-ESDP3m in the ESD cells CELL41-CELL4m, the ESD paths ESDP11-ESDP1m, the ESD paths ESDP21-ESDP2m, and the plurality of ESD the paths ESDP31-ESDP3m in the ESD cells CELL51-CELL5m. Alternatively stated, the ESD paths ESDP11-ESDP1m in the ESD cells CELL41-CELL4m and the ESD paths ESDP11-ESDP1m in the ESD cells CELL51-CELL5m are configured to cooperate to discharge a part of the ESD current IN between the I/O pad 110 and the voltage terminal VDD. The ESD paths ESDP21-ESDP2m in the ESD cells CELL41-CELL4m and the ESD paths ESDP21-ESDP2m in the ESD cells CELL51-CELL5m are configured to cooperate to discharge the other part of the ESD current IN through the semiconductor structures included in the diodes Dn1-Dnm and the diodes Dp'1-Dp'm in both of the ESD cells CELL41-CELL4m and the ESD cells CELL51-CELL5m. The ESD paths ESDP31-ESDP3m in the ESD cells CELL41-CELL4m and the ESD paths ESDP31-ESDP3m in the ESD cells CELL51-CELL5m are configured to cooperate to discharge the other part of the ESD current IN from the cathodes of the diodes Dn1-Dn'm in both of the ESD cells CELL41-CELL4m and the ESD cells CELL51-CELL5m to the voltage terminal VDD. The semiconductor device 600 also provides the plurality of NPN paths P31-P3m in the ESD cells CELL51-CELL5m (which are not shown in FIG. 9D for the sake of brevity) cooperating to shunting a negative latchup current to the voltage terminal VDD.

The arrangements of the ESD cells CELL41-CELL4m and the ESD cells CELL51-CELL5m are given for illustrative purposes. Various configurations of the elements mentioned above are within the contemplated scope of the present disclosure.

Figure 10:
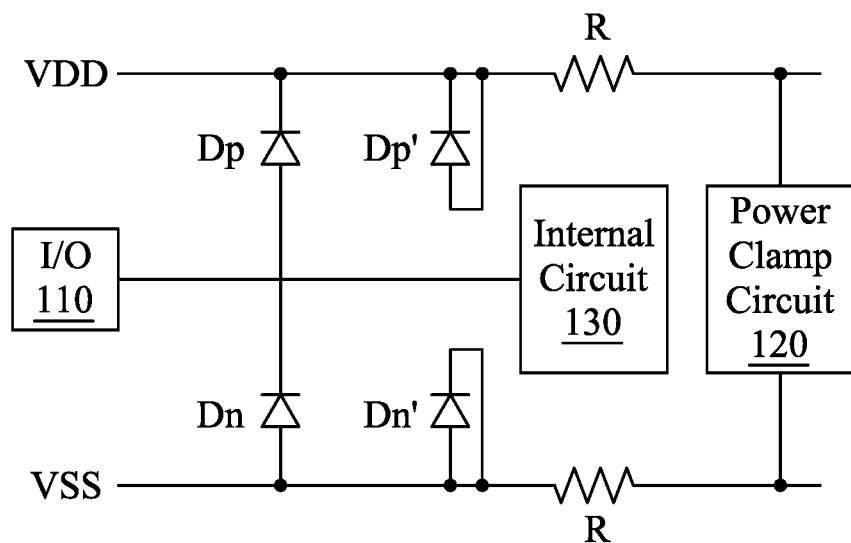
FIG. 10 is an equivalent circuit of part of a semiconductor device, in accordance with various embodiments.

Reference is now made to FIG. 10. FIG. 10 is an equivalent circuit of part of a semiconductor device 1000, in accordance with various embodiments. With respect to the embodiments of FIG. 10, like elements in FIG. 1 and FIG. 6 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 10.

Compared to the embodiments shown in FIG. 1 and FIG. 6, as shown in FIG. 10, the semiconductor device 1000 includes the diodes Dp' and Dn' at the same time. An anode and a cathode of the diode Dp' are coupled to the voltage terminal VDD. An anode and a cathode of the diode Dn' are coupled to the voltage terminal VSS. The co-operation relationship between the diodes Dp' and Dn' will be discussed in detail as below.

Figure 11A:
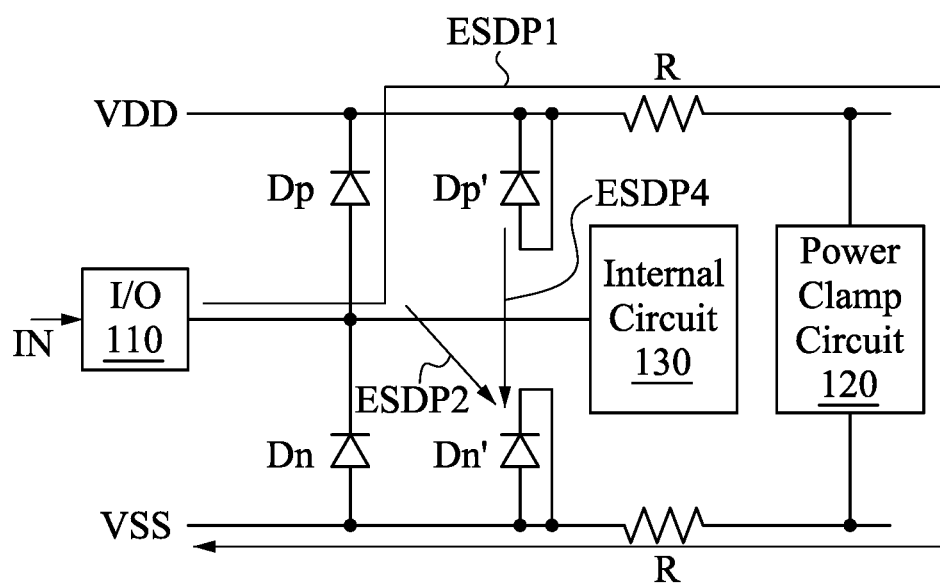
FIG. 11A is a schematic diagram of the operation of the equivalent circuit in FIG. 10 in accordance with various embodiments.

Reference is now made to FIG. 11A. FIG. 11A is a schematic diagram of the operation of the equivalent circuit in FIG. 10 in accordance with various embodiments. With respect to the embodiments of FIG. 11A, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 11A.

For illustration, during an ESD PS mode event at the I/O pad 110, multiple ESD paths, including, for example, an ESD path ESDP4 between the voltage terminals VDD and VSS as shown in FIG. 11A, is conducted in the semiconductor device 1000, compared to the embodiment shown in FIG. 1. To explain in another way, a part of the ESD current IN between the I/O pad 110 and the voltage terminal VSS can be discharged through the ESD path ESDP4. Specifically stated, the diodes Dp' and Dn' include a semiconductor structure configured to direct a part of the ESD current IN from the voltage terminal VDD to the voltage terminal VSS when the voltage level of the I/O pad 110 is the highest, the voltage level of the supply voltage SVDD is higher than of the supply voltage SVSS, and the voltage terminal VSS is coupled to a ground voltage.

Figure 11B:
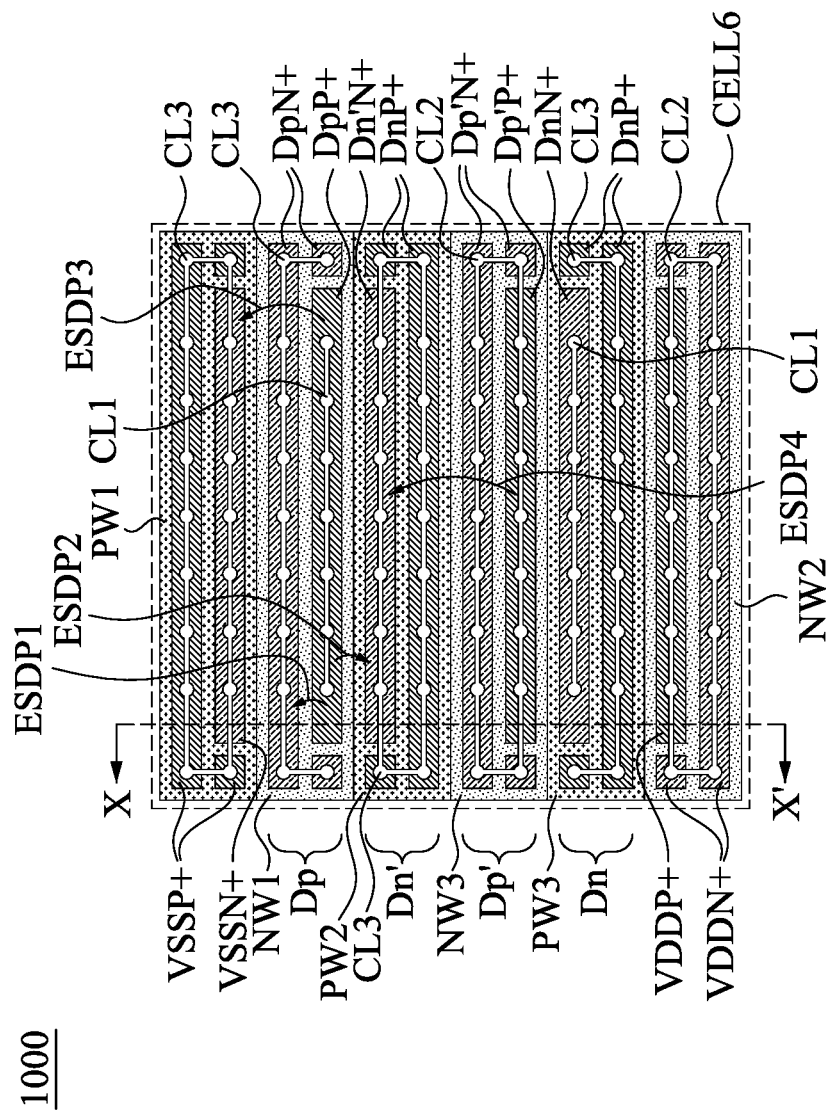
FIG. 11B is a layout diagram in a plan view of a section of the semiconductor device in FIG. 11A in accordance with some embodiments.
Figure 11C:
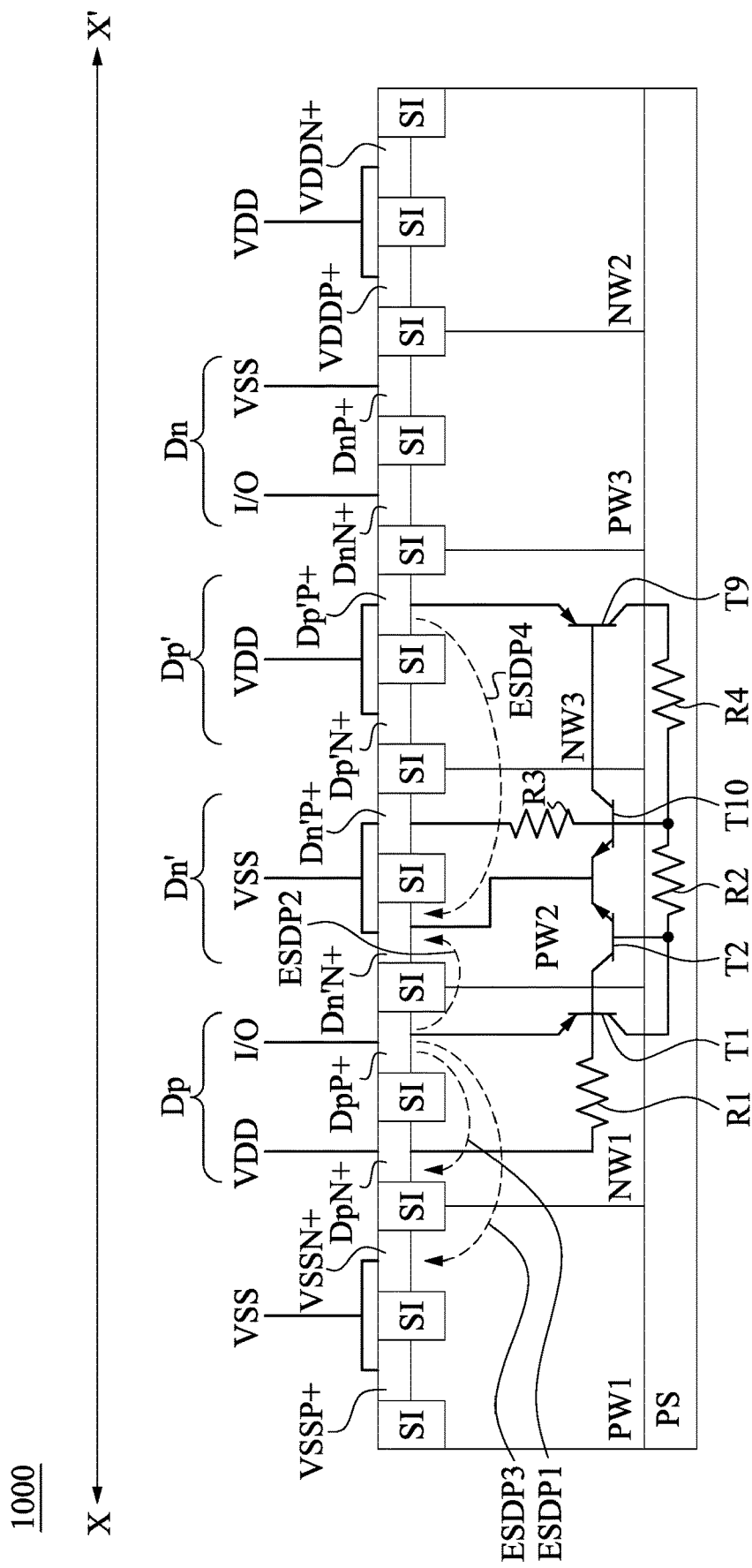
FIG. 11C is a cross-sectional view of the layout diagram of the semiconductor device in FIG. 11B.

For further understanding the structure of the semiconductor device 1000 shown in the embodiment in FIG. 11A, reference is now made to FIGS. 11B and 11C. FIG. 11B is a layout diagram in a plan view of a section of the semiconductor device 1000 in FIG. 11A in accordance with some embodiments. FIG. 11C is a cross-sectional view of the layout diagram of the semiconductor device 1000 in FIG. 11B cross line XX'. With respect to the embodiments of FIG. 11B and FIG. 11C, like elements in FIG. 2A and FIG. 2B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 11B and FIG. 11C.

Compared to the embodiments shown in FIG. 2A and FIG. 2B, as shown in FIG. 11B and FIG. 11C, the semiconductor device 1000 further includes an N-well NW3 adjacent to the P-well PW2 and a P-well PW3 adjacent to the N-well NW3 disposed on the P-type substrate PS (as shown in FIG. 11C), the regions Dp'N+ and Dp'P+ of the diode Dp' disposed in the N-well NW3. Without being disposed in the P-well PW2, the regions DnN+ and DnP+ of the diode Dn are disposed in the P-well PW3. In the embodiment as shown in FIG. 11B, the N-wells NW1, NW2, and NW3, the P-wells PW1, PW2, and PW3, the diodes Dp, Dp', Dn and Dn' and at least part of the semiconductor structure as discussed above are configured to be formed as an ESD cell CELL6 as shown in FIG. 11B. For simplicity of illustration, the I/O pad metal connection layers CL1, the VDD metal connection layers CL2, and the VSS metal connection layers CL3 are not shown in FIG. 11C. However, the scope of the disclosure is not intended to be limited in this kind of the ESD cell, and other suitable kinds of the ESD cell are within the contemplated scope of the present disclosure. For example, the width, the length of the doped regions, the spaces between the doped regions and the arrangement of the connection layers can be modified as needed depending on the current capabilities desired for the semiconductor device 1000.

For illustration, as shown in FIG. 11C, the region Dp'N+ of the diode Dp' is configured as a cathode of the diode Dp'. The region Dp'P+ of the diode Dp' is configured as an anode of the diode Dp'. The regions Dp'P+ and Dp'N+ are configured to be coupled to the voltage terminal VDD to receive the supply voltage SVDD. The region DnN+ of the diode Dn is configured as a cathode of the diode Dn and configured to be coupled to the I/O pad 110. The region DnP+ of the diode Dn is configured as an anode of the diode Dn and configured to be coupled to the voltage terminal VSS.

With the semiconductor structure as discussed above with respect to FIG. 11C, a parasitic PNP transistor T9 and a parasitic NPN transistor T10, and a parasitic resistance R4 are further formed and coupled as shown in FIG. 11C. In some embodiments, the parasitic PNP transistor T9, the parasitic NPN transistor T10, and a parasitic resistance R4 operate together as an equivalent silicon controlled rectifier (SCR) circuit. The equivalent SCR circuit shown in FIG. 11C is given for illustrative purposes. Various equivalent SCR circuits are within the contemplated scope of the present disclosure. For example, in various embodiments, the parasitic resistance R4 is omitted.

The parasitic PNP transistor T9 includes the region Dp'P+ as an emitter, the N-well NW3 as a base, and the P-type substrate PS as a collector. The collector of the parasitic PNP transistor T9 is coupled to a base of the parasitic NPN transistor T10 through the parasitic resistance R4. The parasitic NPN transistor T10 includes the N-well NW3 as a collector, the P-well PW2 as a base, and the region Dn'N+ as an emitter. The collector of the parasitic NPN transistor T10 is coupled to the base of the parasitic PNP transistor T9.

With continued reference to FIG. 11C, for illustration, the region Dp'P+ of the diode Dp', the N-well NW3, the P-type substrate PS, the P-well PW2 and the region Dn'N+ are configured as the ESD path ESDP4 between the voltage terminals VSS and VDD. Compared to the embodiments shown in FIG. 2A and FIG. 2B, in the embodiment shown in FIG. 11C, during an ESD PS mode event, the diode Dp and the power clamp circuit 120 of FIG. 11A are turned to further trigger the ESD path ESDP4. To explain in another way, except a part of the ESD current IN being discharged through the ESD paths ESDP1, ESDP2, and ESDP3, another part of the ESD current IN flows from the voltage terminal VDD, through the ESD path ESDP4, including the parasitic PNP transistor T9, the parasitic resistance R4, and the parasitic NPN transistor T10, to the voltage terminal VSS. With the configuration illustrated in FIGS. 11A-11C, in addition to the ESD paths ESDP1, ESDP2 and ESDP3, the bidirectional SCR circuits are provided. A part of the ESD current IN is further shunted to ground through the ESD path ESDP4 during the ESD PS mode events.

Figure 12A:
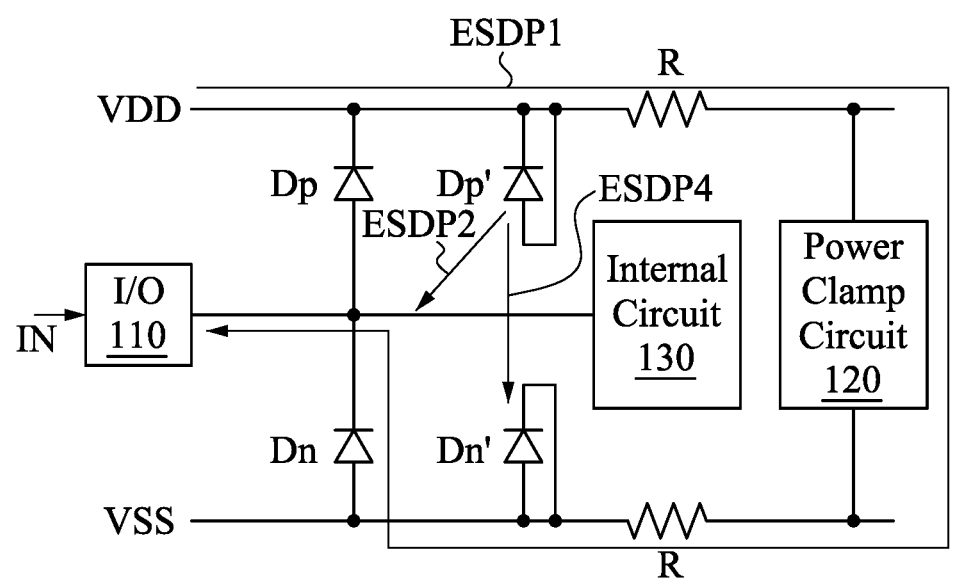
FIG. 12A is a schematic diagram of another operation of the equivalent circuit in FIG. 10 in accordance with various embodiments.
Figure 12B:
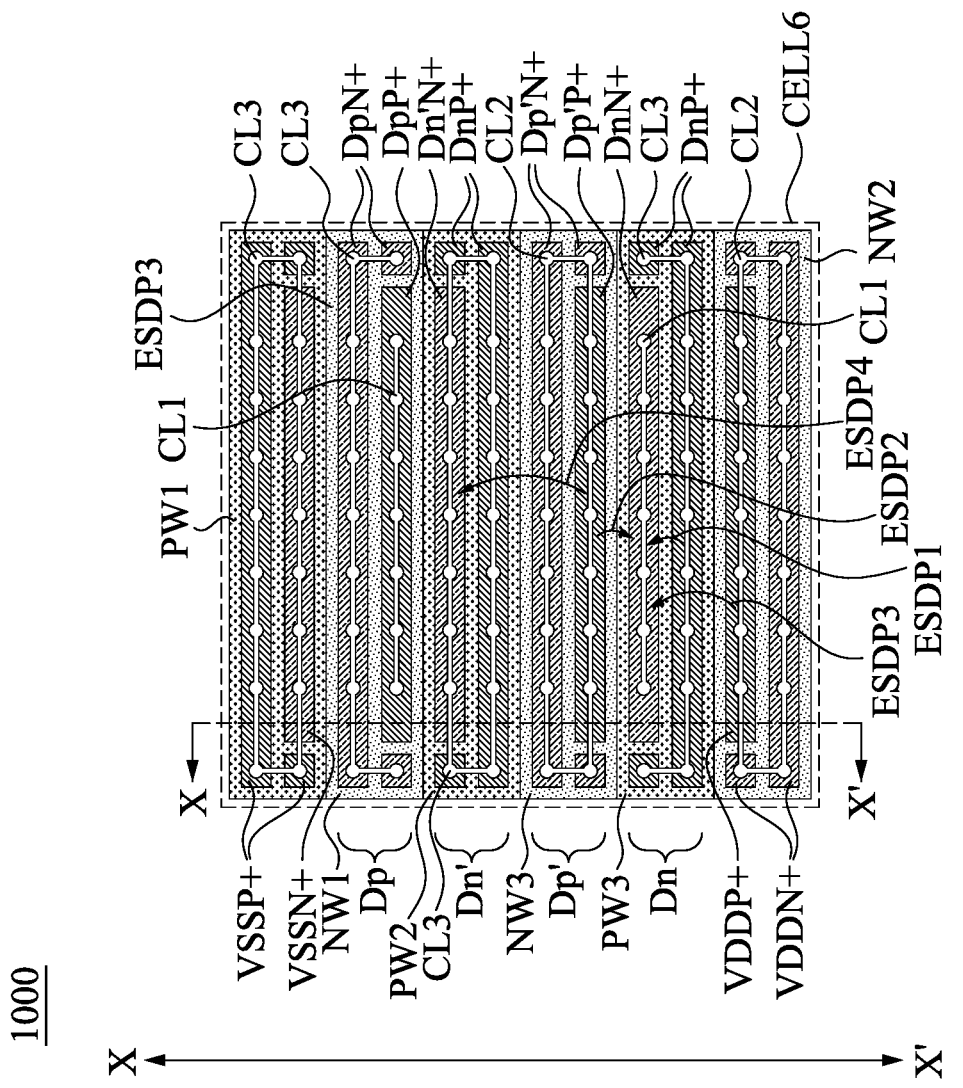
FIG. 12B is a layout diagram in a plan view of a section of the semiconductor device in FIG. 12A in accordance with some embodiments.
Figure 12C:
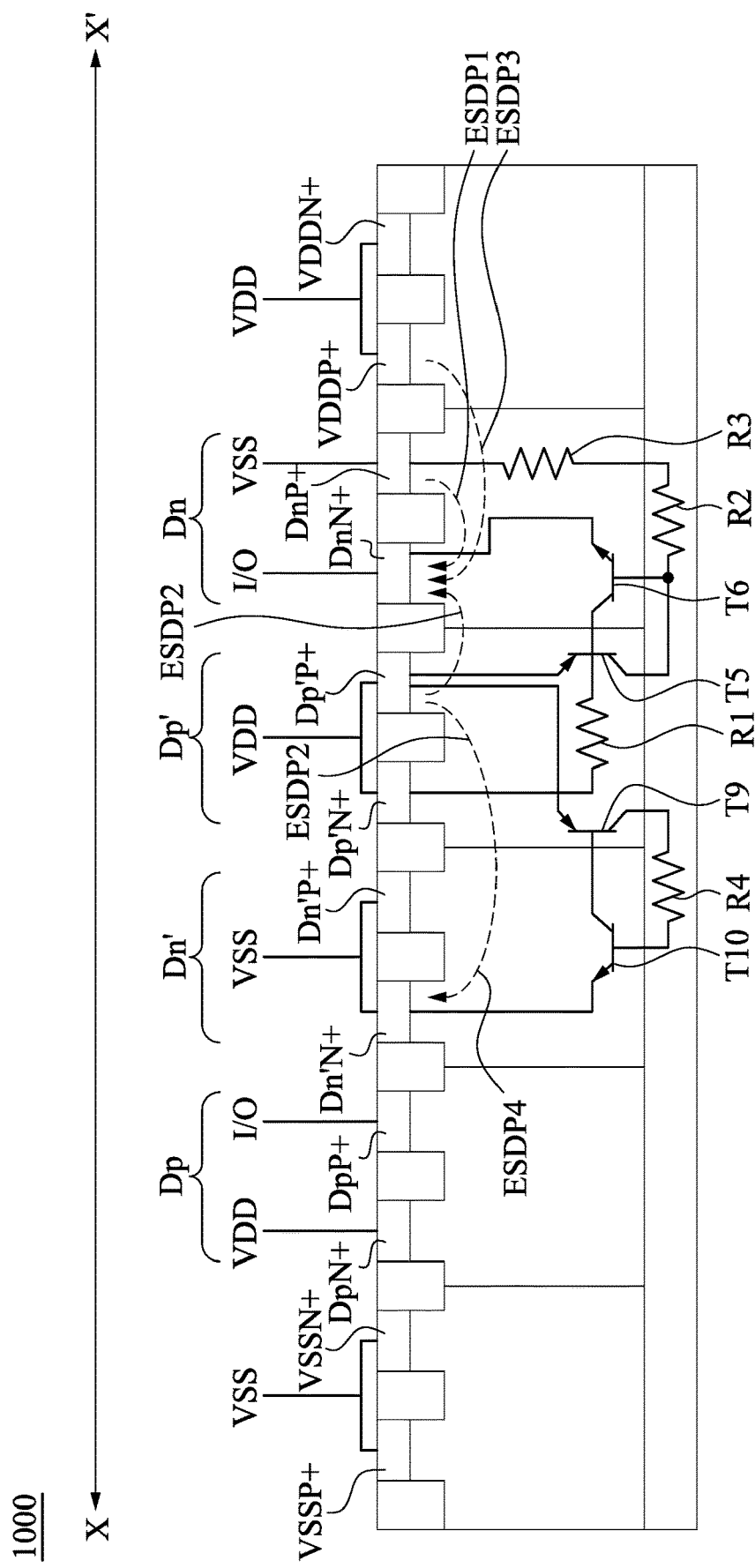
FIG. 12C is a cross-sectional view of the layout diagram of the semiconductor device in FIG. 12B.

Reference is now made to FIG. 12A, FIG. 12B and FIG. 12C. FIG. 12A is a schematic diagram of another operation of the equivalent circuit in FIG. 10 in accordance with various embodiments. FIG. 12B is a layout diagram in a plan view of a section of the semiconductor device 1000 in FIG. 12A in accordance with some embodiments. FIG. 12C is a cross-sectional view of the layout diagram of the semiconductor device 1000 in FIG. 12B along line XX'. With respect to the embodiments of FIG. 12A, FIG. 12B and FIG. 12C, like elements in FIG. 11A, FIG. 11B and FIG. 11C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 12A, FIG. 12B and FIG. 12C.

For illustration, during an ESD ND mode event at the I/O pad 110, the ESD path ESDP4 between the voltage terminals VDD and VSS is conducted in the semiconductor device 1000. Specifically stated in FIG. 12A, the diode Dn and the power clamp circuit 120 are turned and further trigger the ESD path ESDP4. To explain in another way, except a part of the ESD current IN being discharged through the ESD paths ESDP1, ESDP2, and ESDP3, another part of the ESD current IN flows from the voltage terminal VDD, through the ESD path ESDP4 including the parasitic transistor T9, the parasitic resistance R4, and the parasitic transistor T10, to the voltage terminal VSS (the arrow of the ESD path ESDP4 indicates the direction of the current while the electrons flow in a reverse direction). With the configuration illustrated in FIGS. 12A-12C, in addition to the ESD paths ESDP1, ESDP2 and ESDP3, the bidirectional SCR circuits are provided. A part of the ESD current IN is further shunted to ground through the ESD path ESDP4 during the ESD ND mode events.

Figure 13A:
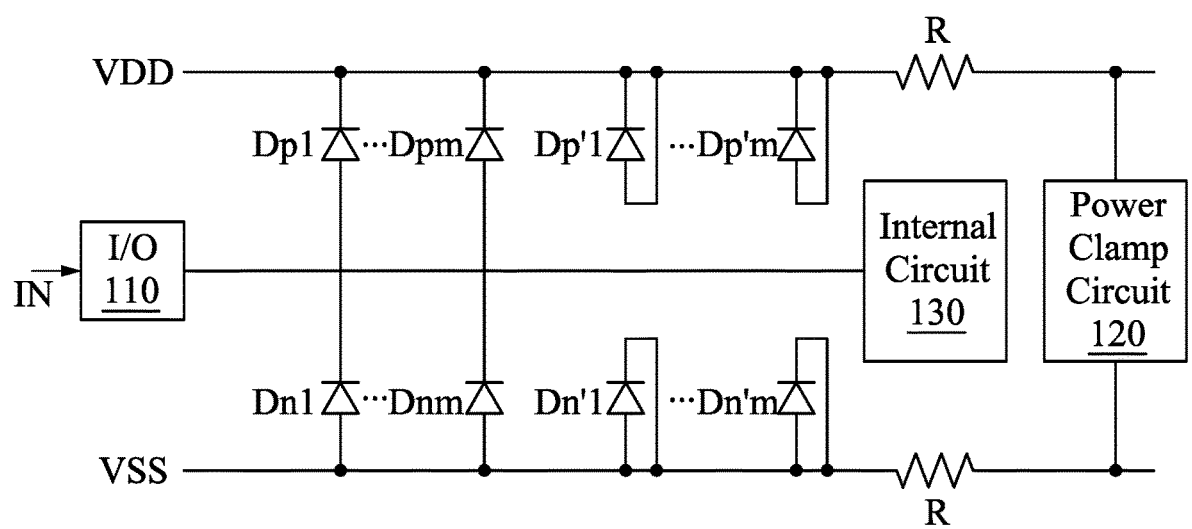
FIG. 13A is an equivalent circuit of part of a semiconductor device.
Figure 13B:
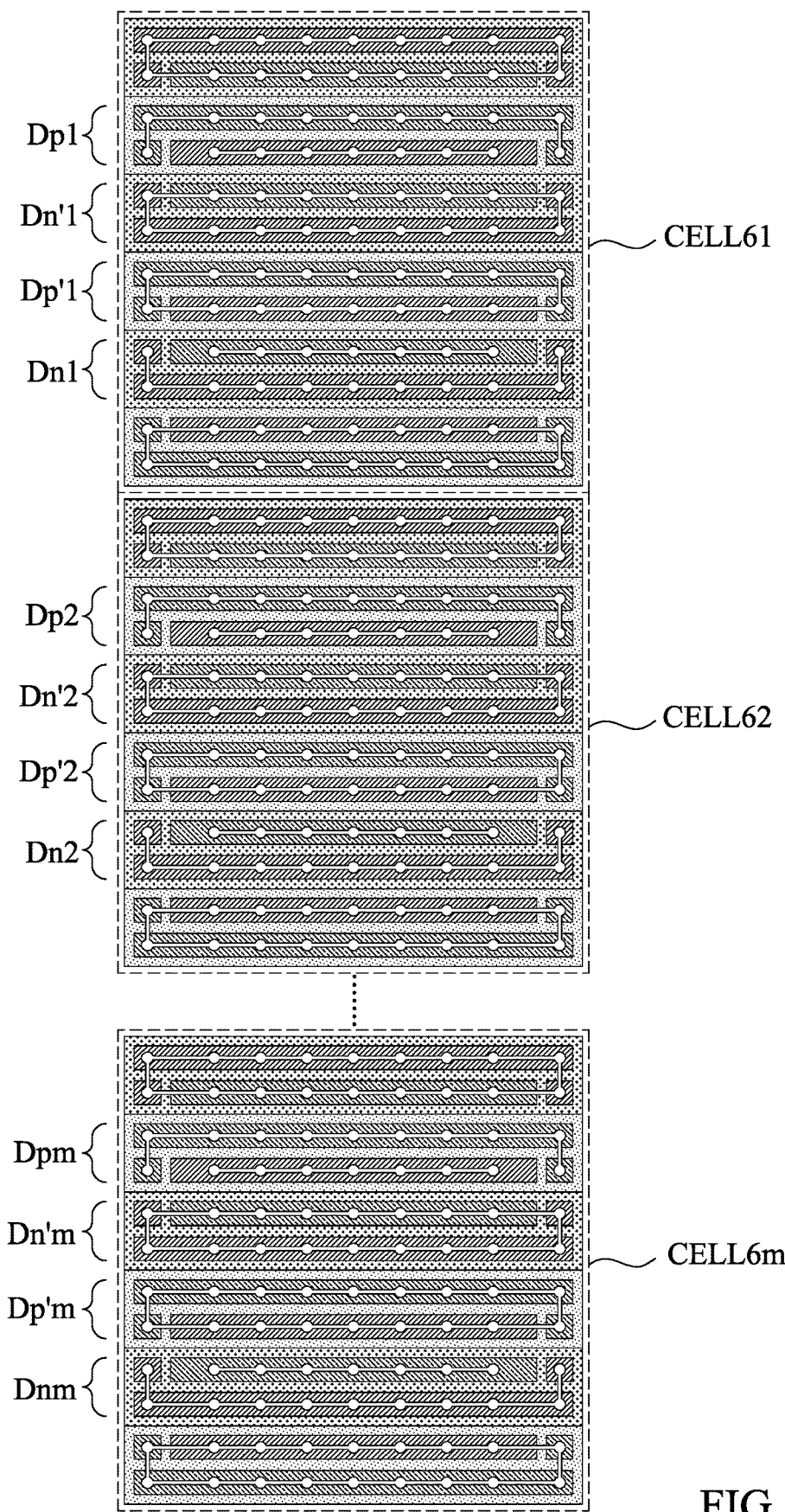
FIG. 13B is a layout diagram in a plan view of a section of the semiconductor device in FIG. 13A in accordance with some embodiments, in accordance with various embodiments.

Reference is now made to FIG. 13A and FIG. 13B. FIG. 13A is an equivalent circuit of part of a semiconductor device 1300. FIG. 13B is a layout diagram in a plan view of a section of the semiconductor device 1300 in FIG. 13A in accordance with some embodiments. With respect to the embodiments of FIG. 13A and FIG. 13B, like elements in FIG. 3A, FIG. 3B, FIG. 8A, FIG. 8B, FIG. 10 and FIG. 11B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 13A and FIG. 13B.

Compared to the embodiments shown in FIG. 10, the semiconductor device 1300 in the embodiment shown FIG. 13A includes the diodes Dp1-Dpm coupled in parallel between the I/O pad 110 and the voltage terminal VDD, the diodes Dn1-Dnm coupled in parallel between the I/O pad 110 and the voltage terminal VSS, the diodes Dn'1-Dn'm coupled in parallel to the voltage terminal VSS, and the diodes Dp'1-Dp'm coupled in parallel to the voltage terminal VDD. Moreover, in some embodiments, the numbers of the diodes Dp1-Dpm, the diodes Dn1-Dnm, the diodes Dn'1-Dn'm, and the diodes Dp'1-Dp'm are different from each other. Alternatively stated, in some embodiments, the semiconductor device 1300 includes at least one diode of the diodes Dp2-Dpm coupled to the Dp1, at least one diode of the diodes Dn2-Dnm coupled to the Dn1, at least one diode of the diodes Dn'2-Dn'm coupled to the Dn'1, and at least one diode of the diodes Dp'2-Dp'm coupled to the Dp'1.

Reference is now made to FIG. 13B. FIG. 13B is a layout diagram in a plan view of a section of the semiconductor device 1300 in FIG. 13A, in accordance with various embodiments. For illustration, the semiconductor device 1300 includes a plurality of ESD cells CELL61-CELL6m arranged in an array. Each one cell of the ESD cells CELL61-CELL6m has the same configuration with the ESD cell CELL6 in the embodiment shown in FIG. 11B. As shown in FIG. 13B, the ESD cell CELL62 is adjacent to the ESD cell CELL61, and so on. However, the scope of the disclosure is not intended to be limited in the aforementioned arrangement of the plurality of the ESD cells in the array, and other suitable kinds of the arrangement of the plurality of the ESD cells are within the contemplated scope of the present disclosure. For example, the number of the ESD cells included in the array can be modified as needed depending on the current capabilities desired for the semiconductor device 1300. The specific operations of similar elements in the embodiments of FIG. 13A and FIG. 13B, which are already discussed in detail in FIGS. 11A-11C and FIGS. 12A-12C, are omitted herein for the sake of brevity.

Figure 14:
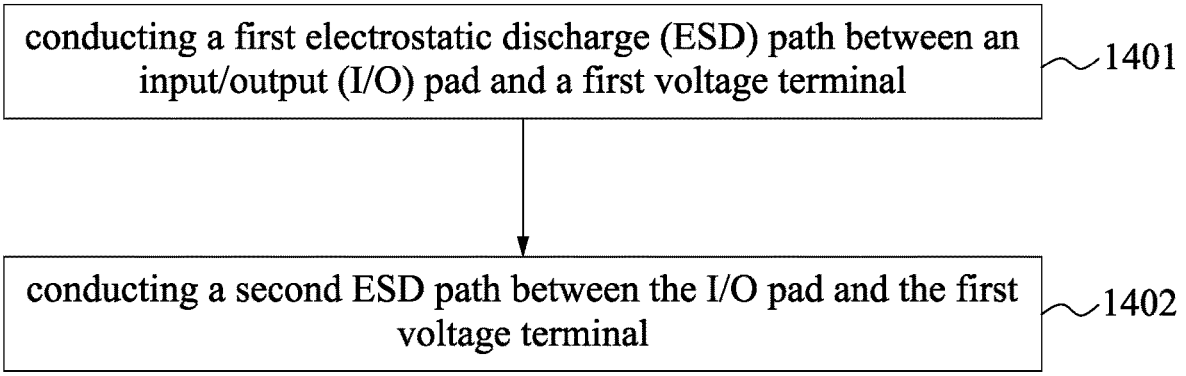
FIG. 14 is a flow chart of a method for operating the semiconductor device, in accordance with various embodiments.

Reference is now made to FIG. 14. FIG. 14 is a flow chart of a method 1400 for operating the semiconductor devices 100, 300, 400, 500, 800, 1000 and 1300 in accordance with various embodiments.

The embodiments illustrated in FIG. 11A, FIG. 11B and FIG. 11C are taken as an example to discuss the method 1400. In step 1401, in some embodiments, during an ESD PS mode event, the ESD path ESDP1 is conducted between the I/O pad 110 and the voltage terminal VSS that is configured to receive the supply voltage SVSS. In the ESD path ESDP1, the diode Dp is coupled between the I/O pad 110 and the voltage terminal VDD to receive the supply voltage SVDD, and the power clamp circuit 120 is coupled between the voltage terminals VDD and VSS.

In step 1402, the ESD path ESDP2 is conducted between the I/O pad 110 and the voltage terminal VSS. In ESD path ESDP2, the diode Dp and the diode Dn' having two terminals that are coupled to the voltage terminal VSS include a semiconductor structure. The semiconductor structure is configured to operate as an equivalent silicon controlled rectifier (SCR) circuit.

In some embodiments, the method 1400 further includes conducting the ESD path ESDP4 between the voltage terminals VDD and VSS. In the ESD path ESDP4, the diode Dn' and the diode Dp' having two terminals that are coupled to the voltage terminal VDD include another semiconductor structure. Another semiconductor structure is configured to operate as another SCR circuit.

In some embodiments, the method 1400 further includes forming the diode Dn at a side of the diode Dp. The diode Dn includes the P-well PW3, the N+ doped region DnN+ coupled to the I/O pad 110, and at least one P+ doped region DnP+ coupled to the voltage terminal VSS. Moreover, in some embodiments, forming the diode Dn further includes forming a plurality of P+ doped regions DnP+1-DnP+N. Each of the plurality of P+ doped regions DnP+1-DnP+N has a strap configuration in a plain view, and the plurality of P+ doped regions DnP+1-DnP+N are arranged along the direction of line XX' as the embodiments shown in FIG. 4B.

In some embodiments, the closer spacing between two doped regions of the semiconductor structures, included in the diodes Dp and Dn', the diodes Dn and Dp', or the diodes Dp' and Dn', results better capacity of shunting the ESD current IN to the ground, in which the semiconductor structures operate as the SCR circuits. For example, as shown in FIG. 2B, the closer the spacing between the region DpP+ of the diode Dp and the Dn'N+ of the diode Dn', the greater effectiveness of the SCR circuit included in the diodes Dp and Dn'.

In some approaches, some semiconductor devices as discussed above include power clamp circuits for the ESD protection to the internal circuits. However, without the semiconductor structure of dummy diodes, such like the diode Dn' and Dp' as provided in the present disclosure, the internal circuits suffer from high voltage drop when the ESD current flows through the pull-up diode, metal routing and the power clamp circuit.

Compared to the above approaches, the present disclosure provides a semiconductor device including at least one new created SCR circuit to discharge the ESD current from the I/O pad to the ground and further to reduce the voltage drop across the internal circuit. Thus, the semiconductor device provided in the present disclosure allows higher ESD robustness for integrated circuit devices compared with previous approaches. Moreover, lower parasitic capacitance from the I/O pad is achieved to be utilized in high speed application.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a semiconductor device is provided, including a first doped region of a first conductivity type configured as a first terminal of a first diode, a second doped region of a second conductivity type configured as a second terminal of the first diode, wherein the first and second doped regions are coupled to a first voltage terminal; a first well of the first conductivity type surrounding the first and second doped regions in a layout view; a third doped region of the first conductivity type configured as a first terminal, coupled to an input/output pad, of a second diode; and a second well of the second conductivity type surrounding the third doped region in the layout view. The second and third doped regions, the first well, and the second well are configured as a first electrostatic discharge path between the I/O pad and the first voltage terminal.

In some embodiments, a method is provided and includes operations below: forming a first well of a first conductivity type surrounding a first doped region of a second conductivity type in a layout view, in which the first doped region is coupled to an input/output pad; and forming a second well of the second conductivity type surrounding a second doped region of the second conductivity type in the layout view. The second doped region is coupled to a first voltage terminal, and an isolation region is interposed between the first and second doped regions. The first to second doped regions and the first to second wells are configured to form a first electrostatic discharge path between the I/O pad and the second doped region.

In some embodiments, a semiconductor device is provided and includes first and second doped regions that are disposed in a first well on a substrate, included in a structure operating as a first diode, and coupled to a first voltage terminal; and a third doped region that is in a second well and coupled to an input/output pad. The first doped region and the second well have the same conductivity type, and the third doped region and the first well have the same conductivity type. The first doped region and the third doped region are configured to transmit a first electrostatic discharge current flowing between the I/O pad and the first voltage terminal providing a first supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   first and second doped regions that are disposed in a first well on a substrate, included in a structure operating as a first diode, and coupled to a first voltage terminal;
   a third doped region that is in a second well and coupled to an input/output (I/O) pad,
   wherein the first doped region and the second well have the same conductivity type, and the third doped region and the first well have the same conductivity type,
   wherein the first doped region and the third doped region are configured to transmit a first electrostatic discharge (ESD) current flowing between the I/O pad and the first voltage terminal providing a first supply voltage; and
   a fourth doped region that is disposed in a third well, different from the first and second wells, and coupled to the first and second doped regions, wherein the third and fourth doped regions are configured as a current discharge path.

2. The semiconductor device of claim 1, further comprising:
   a fifth doped region, wherein the fourth and fifth doped regions are included in a structure operating as a second diode coupled between the I/O pad and the first voltage terminal,
   wherein the third doped region is arranged between the first and second diodes.

3. The semiconductor device of claim 1, further comprising:
   a plurality of fifth doped regions that are in the third well and included in a structure operating as a second diode coupled between the I/O pad and the first voltage terminal,
   wherein the plurality of fifth doped regions are further included in the current discharge path.

4. The semiconductor device of claim 3, wherein the first and second diodes are arranged on opposite sides of the third doped region.

5. The semiconductor device of claim 1, further comprising:
   a fifth doped region that is disposed in the second well and coupled to a second voltage terminal providing a second supply voltage different from the first supply voltage,
   wherein the third and fifth doped regions and the second well are configured to transmit a second ESD current flowing between the I/O pad and the second voltage terminal.

6. A semiconductor device, comprising:
   a first well of a first conductivity type surrounding a first doped region of a second conductivity type in a layout view, wherein the first doped region is coupled to an input/output (I/O) pad; and
   a second well of the second conductivity type surrounding a second doped region of the first conductivity type in the layout view, wherein the second doped region is coupled to a first voltage terminal, and
   an isolation region is interposed between the first and second doped regions,
   wherein the first to second doped regions and the first to second wells are configured to form a first electrostatic discharge (ESD) path between the I/O pad and the second doped region.

7. The semiconductor device of claim 6, further comprising:
   a third doped region of the first conductivity type that are in the first well and coupled to a second voltage terminal,
   wherein the first doped region, the third doped region and the first well are configured to form a second ESD path between the I/O pad and the first voltage terminal.

8. The semiconductor device of claim 7, further comprising:
   a plurality of fourth doped regions of the second conductivity type in a third well of the second conductivity type, wherein the first well is sandwiched between the second and third wells,
   wherein the first doped region is further arranged between the third doped region and the plurality of fourth doped regions.

9. The semiconductor device of claim 8, wherein the plurality of fourth doped regions are coupled to the first voltage terminal configured to have a voltage level lower than that of the second voltage terminal.

10. The semiconductor device of claim 6, further comprising:
    a third doped region of the second conductivity type in a third well of the second conductivity type, wherein the first well is arranged between the second and third wells,
    wherein the third doped region is coupled to the first voltage terminal,
    wherein the third doped region, the third well, the first well, and the first doped region are configured to form a second ESD path between the first voltage terminal.

11. The semiconductor device of claim 10, further comprising:
    a fourth doped region of the second conductivity type that is arranged in the third well and coupled to the first voltage terminal, wherein the first doped region, the first well, the third well, and the fourth doped region are configured to form a third ESD path between the I/O pad and the first voltage terminal.

12. The semiconductor device of claim 6, further comprising:
    a third doped region of the first conductivity type arranged in a third well adjacent to the first well, and coupled to the I/O pad; and
    a plurality of fourth doped regions of the second conductivity type arranged in the third well and coupled to the first voltage terminal, wherein the third doped region is sandwiched between the first doped region and the plurality of fourth doped regions.

13. The semiconductor device of claim 12, wherein the first doped region, the first well, the third well and the plurality of fourth doped regions are configured to form electrostatic discharge(ESD) paths between the I/O pad and the first voltage terminal.

14. A semiconductor device, comprising:
    a first doped region of a first conductivity type configured as a first terminal of a first diode;
    a second doped region of a second conductivity type configured as a second terminal of the first diode, wherein the first and second doped regions are coupled to a first voltage terminal;

a first well of the first conductivity type surrounding the first and second doped regions in a layout view;
a third doped region of the first conductivity type configured as a first terminal, coupled to an input/output (I/O) pad, of a second diode; and
a second well of the second conductivity type surrounding the third doped region in the layout view,
wherein the second and third doped regions, the first well, and the second well are configured as a first electrostatic discharge (ESD) path between the I/O pad and the first voltage terminal.

15. The semiconductor device of claim 14, wherein the first well and the second well are adjacent to each other.

16. The semiconductor device of claim 14, wherein the second doped region is arranged between the first and third doped regions.

17. The semiconductor device of claim 14, further comprising:
a third well of the first conductivity type, wherein the second well is sandwiched between the first well and the third well; and
a plurality of fourth doped regions that are in the third well and coupled to the first voltage terminal,
wherein the third doped region, the second well, the third well, and the plurality of fourth doped regions are configured as a second ESD path between the I/O pad and the first voltage terminal.

18. The semiconductor device of claim 14, wherein the first to third doped regions and the first and second wells are configured in a cell of a layout of the semiconductor device, and the semiconductor device further comprises:
a plurality of the cells arranged in an array.

19. The semiconductor device of claim 14, further comprising:
a third well of the first conductivity type, wherein the second well is sandwiched between the first well and the third well;
a plurality of fourth doped regions of the first conductivity type that are in the third well and coupled to the first voltage terminal; and
a fifth doped region of the second conductivity type that is arranged in the third well and between the third doped region and the plurality of fourth doped regions and coupled to the I/O pad,
wherein the third doped region, the second well, the third well, and the plurality of fourth doped regions are configured as a second ESD path between the I/O pad and the first voltage terminal.

20. The semiconductor device of claim 19, wherein the plurality of fourth doped regions and the second doped region are arranged on opposite sides of the third doped region.

* * * * *